(12) United States Patent
Flynn et al.

(10) Patent No.: US 7,898,278 B2
(45) Date of Patent: Mar. 1, 2011

(54) POWER CONTROL CIRCUITRY, CIRCUITRY FOR ANALYSING A SWITCHED POWER RAIL, AND METHOD OF CONTROLLING CONNECTION OF A POWER SOURCE TO A SWITCHED POWER RAIL

(75) Inventors: David Walter Flynn, Cambridge (GB); Leah Elizabeth Schuth, San Jose, CA (US); Sachin Satish Idgunji, San Jose, CA (US)

(73) Assignee: ARM Limited, Cambridge (GB)

( * ) Notice: Subject to any disclaimer, the term of this patent is extended or adjusted under 35 U.S.C. 154(b) by 351 days.

(21) Appl. No.: 11/979,541

(22) Filed: Nov. 5, 2007

(65) Prior Publication Data

US 2009/0115258 A1 May 7, 2009

(51) Int. Cl.
*G01R 31/28* (2006.01)

(52) U.S. Cl. .................. 324/763; 327/544; 327/538

(58) Field of Classification Search .................. 323/267, 323/268, 358; 307/38, 129; 326/31, 33, 326/34, 101, 102; 327/538, 544; 324/763
See application file for complete search history.

(56) References Cited

U.S. PATENT DOCUMENTS

| | | | | |
|---|---|---|---|---|
| 5,434,545 A | * | 7/1995 | Burchfield | 331/143 |
| 5,821,823 A | * | 10/1998 | Bereza | 331/57 |
| 6,028,491 A | * | 2/2000 | Stanchak et al. | 331/75 |
| 6,212,079 B1 | * | 4/2001 | Balakrishnan et al. | 363/21.03 |
| 6,222,285 B1 | * | 4/2001 | Haley et al. | 307/129 |
| 6,515,537 B2 | * | 2/2003 | Kleveland | 327/538 |
| 7,219,244 B2 | * | 5/2007 | Kuang et al. | 713/320 |
| 7,504,854 B1 | * | 3/2009 | Look et al. | 326/38 |
| 7,605,644 B2 | * | 10/2009 | Idgunji et al. | 327/544 |
| 2004/0167421 A1 | * | 8/2004 | Gregory et al. | 600/547 |
| 2006/0279970 A1 | * | 12/2006 | Kernahan | 363/65 |
| 2007/0019442 A1 | * | 1/2007 | Li et al. | 363/15 |

(Continued)

OTHER PUBLICATIONS

"7.5 Dynamic Voltage Conversion" pp. 241-242, *Energy Efficient Microprocessor Design*.
U.S. Appl. No. 11/797,497—Inventor: Idgunji et al.—filed May 3, 2007.

*Primary Examiner*—Adolf Berhane
*Assistant Examiner*—Yemane Mehari
(74) *Attorney, Agent, or Firm*—Nixon & Vanderhye P.C.

(57) ABSTRACT

Power control circuitry is provided for controlling connection of a power source having a source voltage level to a switched power rail to provide power to an associated circuit block. The power control circuitry comprises a switch block for selectively connecting the switched power rail to the power source, and a switch controller for controlling operation of the switch block. A ring oscillator circuit is powered from the switched power rail and produces an oscillating output signal, and analysis circuitry is then used to analyse change in frequency of the oscillating output signal produced by the ring oscillator circuit during a period of time when the switched power rail is not at the source voltage level. The switch controller is then arranged to control at least one aspect of the operation of the switch block in dependence on the analysis. This technique provides a simple and effective digital technique for observing voltage changes on the switched power rail.

22 Claims, 15 Drawing Sheets

U.S. PATENT DOCUMENTS

| | | | |
|---|---|---|---|
| 2007/0182386 A1* | 8/2007 | Garner | 323/225 |
| 2008/0100350 A1* | 5/2008 | Pernia et al. | 327/114 |
| 2008/0272652 A1* | 11/2008 | Idgunji et al. | 307/38 |
| 2008/0278223 A1* | 11/2008 | Kernahan et al. | 327/538 |
| 2008/0307240 A1* | 12/2008 | Dahan et al. | 713/320 |
| 2009/0315583 A1* | 12/2009 | Rius Vazquez et al. | 324/763 |

\* cited by examiner

POWER CONTROL CIRCUITRY, CIRCUITRY FOR ANALYSING A SWITCHED POWER RAIL, AND METHOD OF CONTROLLING CONNECTION OF A POWER SOURCE TO A SWITCHED POWER RAIL

BACKGROUND OF THE INVENTION

1. Field of the Invention

The present invention relates to power control circuitry, circuitry for analysing an on-chip switched power rail, and a method of controlling connection of a power source to an on-chip switched power rail.

2. Description of the Prior Art

It is known to provide circuits that include power rails connected via switch blocks to switched power rails. Circuit blocks can then be arranged to draw their power from the switched power rails. The switch blocks may be provided as header switch blocks for connecting a supply voltage rail to a switched supply voltage rail, or may be footer switch blocks for connecting a ground voltage rail with a switched ground voltage rail. Indeed, some circuits may include both header switch blocks and footer switch blocks. The switch blocks are typically constructed using high threshold transistors, and can be used to isolate the switched power rail from the main power rail and accordingly isolate the associated circuit blocks from the power source. This is useful in reducing power consumption within the circuits, for example by reducing the static leakage current therethrough.

The operation of the various switch blocks is typically controlled by a switch controller, and the switch controller will typically control the operation of the switch block having regards to expected characteristics of the switch block, such as expected turn on time, turn off time, etc. However, the actual characteristics of the switch block will vary depending on process variations in manufacture, local temperature, variations in supply voltage, etc. If the actual characteristics of the switch block could be determined in situ, it would enable the operation of the switch block to be managed more efficiently, potentially allowing quicker turn on and turn off characteristics, less power consumption, etc.

However, to determine the actual characteristics of the switch block, it would be useful to observe one or more properties of the analogue voltage present on the switched power rail, but it is difficult to make such analogue voltage measurements in an unintrusive manner. Analogue voltage measurements typically require exposing the switched power rail off chip, which then adds capacitive load and itself affects the turn on characteristic. Another possibility would be to seek to develop mixed-signal analogue-to-digital converters for deployment on-chip, but such direct access techniques may tend to compromise the measurement more than an indirect approach.

In addition to using the switch block to connect the switched power rail to the power source so as to enable normal operation of the associated circuit block, or to decouple the switched power rail from the power source when the circuit block is turned off so as to reduce power consumption, the switch controller may also control the switch block in a more complex manner to achieve other modes of operation. For example, commonly assigned co-pending U.S. patent application Ser. No. 11/797,497, the entire contents of which are hereby incorporated by reference, describes the use of a state retention mode for a circuit block, where the switch controller modulates conduction through the switch block to maintain the switched power rail at an intermediate voltage level. To improve the efficiency of such mechanisms, it would also be beneficial to readily determine information about the analogue voltage on the switched power rail at particular points in time, as that would assist in performing the required modulation.

Accordingly, it would be desirable to provide a simple and effective mechanism for observing the switched power rail so as to improve power control using a switch block coupled between a power source and a switched power rail.

SUMMARY OF THE INVENTION

Viewed from a first aspect, the present invention provides power control circuitry for controlling connection of a power source having a source voltage level to a switched power rail used to provide power to an associated circuit block, the power control circuitry comprising: a switch block for selectively connecting the switched power rail to the power source; a switch controller for controlling operation of the switch block; ring oscillator circuitry powered from the switched power rail and producing an oscillating output signal; and analysis circuitry for analysing change in frequency of the oscillating output signal produced by the ring oscillator circuitry during a period of time when the switched power rail is not at the source voltage level, and to cause the switch controller to control at least one aspect of the operation of the switch block in dependence on said analysis.

In accordance with the present invention ring oscillator circuitry is provided which is arranged so that it is powered from the switched power rail. A ring oscillator circuit is a known digital circuit that can be formed from standard cell components and has been used in existing circuits for a variety of purposes. For example, ring oscillators may be used for steady state analysis of voltage/process/temperature and general silicon characterisation. Indeed, ARM Limited has sponsored research work by T. Burd at the University of Berkeley, Calif. in the mid 1990's using an ARM810 microprocessor core with voltage and frequency scaling controlled around such a Ring Oscillator approach, as referenced in "Energy Efficient Microprocessor Design", by T D Burd et al, Kliuwer Academic Press, 2002, section 7.5.1 and figure 7.20 specifically.

Such ring oscillators are typically only used during a normal operating mode when they are supplied with the normal operating voltage. However, in accordance with the present invention, the ring oscillator circuitry is arranged to produce an oscillating output signal during a period of time when the switched power rail is not at the source voltage level, as for example may be the case during a turn on operation, a turn off operation, when implementing the earlier-mentioned state retention mode of operation, etc. Analysis circuitry is then used to analyse change in frequency of the oscillating output signal produced by the ring oscillator circuitry. Since the ring oscillator circuitry is powered from the switched power rail, such changes in frequency will be dependent on the voltage on the switched power rail and hence the analysis circuitry can infer information about the state of the switched power rail at any particular point in time by analysing the frequency of the oscillating output signal. Accordingly, through this analysis, information can be determined which can be used to control at least one aspect of the operation of the switch block.

Whilst in one embodiment the absolute frequency of the oscillating output signal is determined by the analysis circuitry, for example with reference to a system clock signal, in an alternative embodiment the relative frequency of the oscillating output signal can be determined by comparison with an additional ring oscillator circuit. In particular, in one embodiment, the power control circuitry further comprises: additional ring oscillator circuitry powered from the power source and producing an additional oscillating output signal; the analysis circuitry performing said analysis by comparing frequency of the oscillating output signal with frequency of the additional oscillating output signal and controlling said at least one aspect of the operation of the switch block in dependence on said comparison. The use of an additional ring oscillator circuit in this manner can automatically compensate for process and temperature variations.

Whilst the ring oscillator circuits can be arranged to operate at different speeds given a particular supply voltage, in one embodiment the additional ring oscillator circuitry and the ring oscillator circuitry are of identical construction. This further improves tolerance to process and/or temperature variations when performing the analysis.

In one embodiment, said switch block is a header block, said power source is a supply voltage rail and said switched power rail is a switched supply voltage rail. In an alternative embodiment, said switch block is a footer block, said power source is a ground voltage rail and said switched power rail is a switched ground voltage rail. In some embodiments, multiple switch blocks may be used, and indeed some switch blocks may be header switch blocks whilst other switch blocks are footer switch blocks.

In one embodiment, said ring oscillator circuitry is gated via an enable signal, during normal operation of the associated circuit block where voltage on the switched power rail is at the source voltage level, the ring oscillator circuitry being disabled to reduce power consumption. Since the ring oscillator circuitry is provided for the purpose of analysis during periods of time when the switched power rail is not at the source voltage level, it may be beneficial to turn that ring oscillator circuitry off during normal operation so as to reduce power consumption, and by providing a gated ring oscillator circuit this can be readily achieved.

Further, it may be the case that even during the period of time when the switched power rail is not at the source voltage level, it is not necessary for the ring oscillator circuitry to be permanently enabled, and instead it may be sufficient merely for the ring oscillator circuitry to be periodically enabled during that time, this giving rise to further power consumption reductions.

There are a number of situations where the use of the ring oscillator circuitry and associated analysis circuitry of embodiments of the present invention may assist in controlling the switch block. In one embodiment, on turning on at least part of the switch block to begin pulling voltage on the switched voltage rail to the source voltage level, the analysis circuitry analyses the change in frequency of the oscillating output signal in order to derive information indicative of at least one analogue voltage property of the switched voltage rail.

The at least one analogue voltage property can take a variety of forms, and hence for example may be the voltage level itself, or alternatively may identify the rate of change of the voltage over time. Through use of this embodiment, the initial start up of the ring oscillator circuitry before the voltage is stable provides an indirect measurement of such analogue voltage properties through the frequency behaviour of the oscillating output signal from the ring oscillator circuitry, and this can be analysed by the analysis circuitry to produce information used to control operation of the switch block.

The manner in which the switch block is controlled dependent on the information produced by the analysis circuitry can take a variety of forms. For example, often the switch block is made up of multiple switch block portions and those switch block portions may be turned on in sequence during the turn on operation. The particular sequence used could be controlled dependent on the information derived from the analysis circuitry. By way of a specific example, the change in frequency of the output from the ring oscillator circuitry during the turn on phase could be used to determine the rate at which the voltage on the switched voltage rail is changing, and that could be used to control how the multiple switch block portions are used so as to maintain a desired rate of change of the switched voltage rail.

As another example, in one embodiment the switch block comprises multiple switch block portions including at least one starter switch block portion and at least one main switch block portion, and the at least one aspect of the operation of the switch block controlled based on the analysis performed by the analysis circuitry is a determination as to when to turn on the at least one main switch block portion. Once the main switch block portion has been turned on, the switched power rail is determined to be at the required operating voltage for the associated circuit block, and accordingly the normal operation of that associated circuit block can begin.

However, the use of the ring oscillator circuitry and associated analysis circuitry is not limited to situations where the switch block is being turned on. In one embodiment, on turning off at least part of the switch block to decouple voltage on the switched voltage rail from the source voltage level, the analysis circuitry analyses the change in frequency of the oscillating output signal in order to derive information indicative of at least one analogue voltage property of the switched voltage rail. Hence, in accordance with this embodiment, the analysis circuitry can perform an analysis during the collapse time of the switched power rail. This information can be used for a variety of purposes. For example, in one embodiment, when subsequently turning on the switch block to begin pulling voltage on the switched voltage rail to the source voltage level, said information is used to influence a turn on procedure employed by the switch controller. For example, depending on how quickly the analogue voltage on the switched voltage rail has changed during the turn-off period, or the actual analogue voltage reached by the time the switch block is subsequently turned on, the turn on procedure can be altered with the aim of improving the efficiency of the turn on procedure having regards to the analogue voltage properties of the switched voltage rail at the time the turn on procedure is to start. This may allow a quicker return to the full power on state than might otherwise be possible.

In addition to using the analysis performed by the analysis circuitry to control at least one aspect of the operation of the switch block, that analysis can also be used for other purposes. For example, in one embodiment, the analysis performed by the analysis circuitry further provides diagnostic data indicative of turn on characteristics of the switch block. For example, it may over time be determined that the switch block is taking longer and longer to pull the voltage on the switched voltage rail to the source voltage level and this may be indicative of a "wear out" of one or more of the components of the switch block.

In addition to using the ring oscillator circuitry and associated analysis circuitry of embodiments of the present invention during turn-on and turn-off procedures, the same circuitry can additionally, or alternatively, be used when performing other operations requiring use of the switch block, for example the earlier-mentioned state retention mode of operation. In particular, in one embodiment, said switch controller modulates conduction through said switch block to maintain said switched power rail at an intermediate voltage level, said analysis circuitry analyses a difference in frequency between the oscillating output signal and the additional oscillating output signal in order to derive information indicative of at least one analogue voltage property of the switched voltage rail, and said information is input to the switch controller as a feedback signal to adjust said modulation to maintain said intermediate voltage within a predetermined voltage range.

In one embodiment, the switch controller controls a duty ratio of the modulation in accordance with the feedback signal in order to maintain the intermediate voltage within the predetermined range of voltages. Such embodiments allow adaptive control of the modulation across a range of circuits that can be subject to considerable process, voltage and temperature variations.

In one embodiment, the feedback signal serves to maintain the intermediate voltage with a hysteresis characteristic resulting in a periodic variation in the intermediate voltage, such as by switching the switch block to a conductive state when the voltage difference across the associated circuit block is too low, and switching the switch block to a non-conductive state when the voltage difference across the associated circuit block is too high, with these trigger levels being spaced apart.

In one embodiment, the additional ring oscillator circuitry and the ring oscillator circuitry are of identical construction, the power control circuitry further comprises divider circuitry for modifying the oscillating output signal produced by the ring oscillator circuitry before the difference in frequency is determined by the analysis circuitry. By dividing the oscillating output signal produced by the ring oscillator circuitry so as to in effect reduce the frequency, this facilitates more precise detection of changes in the frequency difference between the output of the two ring oscillator circuits.

In one embodiment, the outputs from the pair of ring oscillating circuits can additionally be used during normal operation to give additional diagnostic information. For example, in one embodiment, during normal operation of the associated circuit block the voltage on the switched power rail differs from the source voltage level due to a voltage drop across the switch block, and the analysis circuitry continues to compare the frequency of the oscillating output signal with the frequency of the additional oscillating output signal in order to derive information indicative of said voltage drop. This information can be used for diagnostic purposes, for example at test silicon stage to identify the voltage drop across the switch block. Further, it could be used in production silicon to influence circuit operation, for example by reducing the operating frequency if the voltage drop becomes larger than an acceptable level.

Whilst the technique of embodiments of the present invention could be used to provide intermediate voltage levels for a variety of different purposes, for example for providing dynamic voltage scaling operation during processing by the associated circuit block so as to match the supply voltage for the associated circuit block to a desired clock frequency, the present technique may also be used to good effect for data retention when the associated circuit block is static. In accordance with this technique, it is recognised that the associated circuit block can retain state signal values when static using lower voltage difference across the circuit block than would be acceptable when the circuit block were active in performing its intended processing activity. This is exploited by using the switch controller to modulate conduction through the switch block to maintain the switched power rail voltage at a level sufficient to retain the state signal values, but below the normal operational voltage(s) in a manner that reduces power consumption for the circuit block compared to its power consumption if static when using the normal operating voltage. Thus, static power consumption (leakage) can be reduced without the need to employ additional balloon latches and the transition back to active processing can be made by a relatively rapid increase in the voltage of the switched power rail back to a level capable of supporting active processing followed by restarting the clock.

Whilst the ring oscillator and associated analysis circuitry is useful in controlling at least one aspect of the operation of the switch block, the output from the analysis circuitry can also be used for other purposes. Accordingly, viewed from a second aspect, the present invention provides circuitry for analysing a switched power rail used to provide power to an associated circuit block, the switched power rail being connectable to a power source having a source voltage level, the circuitry comprising: a switch block for selectively connecting the switched power rail to the power source; a switch controller for controlling operation of the switch block; ring oscillator circuitry powered from the switched power rail and producing an oscillating output signal; and analysis circuitry for analysing change in frequency of the oscillating output signal produced by the ring oscillator circuitry during a period of time when the switched power rail is not at the source voltage level in order to produce information characterising at least one analogue voltage property of the switched power rail. In this embodiment, the analysis circuitry may be provided on-chip or off-chip. The information produced as a result of the analysis may, for example, be used for implementation verification, or for analysing the ageing characteristics of the power switch circuitry (the turn-on characteristics may deteriorate as the switch(es) suffer some form of wear-out over prolonged use).

Viewed from a third aspect, the present invention provides a method of controlling connection of a power source having a source voltage level to a switched power rail used to provide power to an associated circuit block, the method comprising the steps of: selectively connecting the switched power rail to the power source via a switch block; operating ring oscillator circuitry from the switched power rail in order to produce an oscillating output signal; analysing change in frequency of the oscillating output signal produced by the ring oscillator circuitry during a period of time when the switched power rail is not at the source voltage level; and controlling at least one aspect of the operation of the switch block in dependence on said analysis.

Viewed from a fourth aspect, the present invention provides power control logic for controlling connection of a power source means having a source voltage level to a switched power rail means used to provide power to an associated circuit block means, the power control logic comprising: a switch block means for selectively connecting the switched power rail means to the power source means; a switch controller means for controlling operation of the switch block means; ring oscillator means powered from the switched power rail means for producing an oscillating output signal; and analysis means for analysing change in frequency of the oscillating output signal produced by the ring oscillator means during a period of time when the switched power rail means is not at the source voltage level, and to cause the switch controller means to control at least one aspect of the operation of the switch block means in dependence on said analysis.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
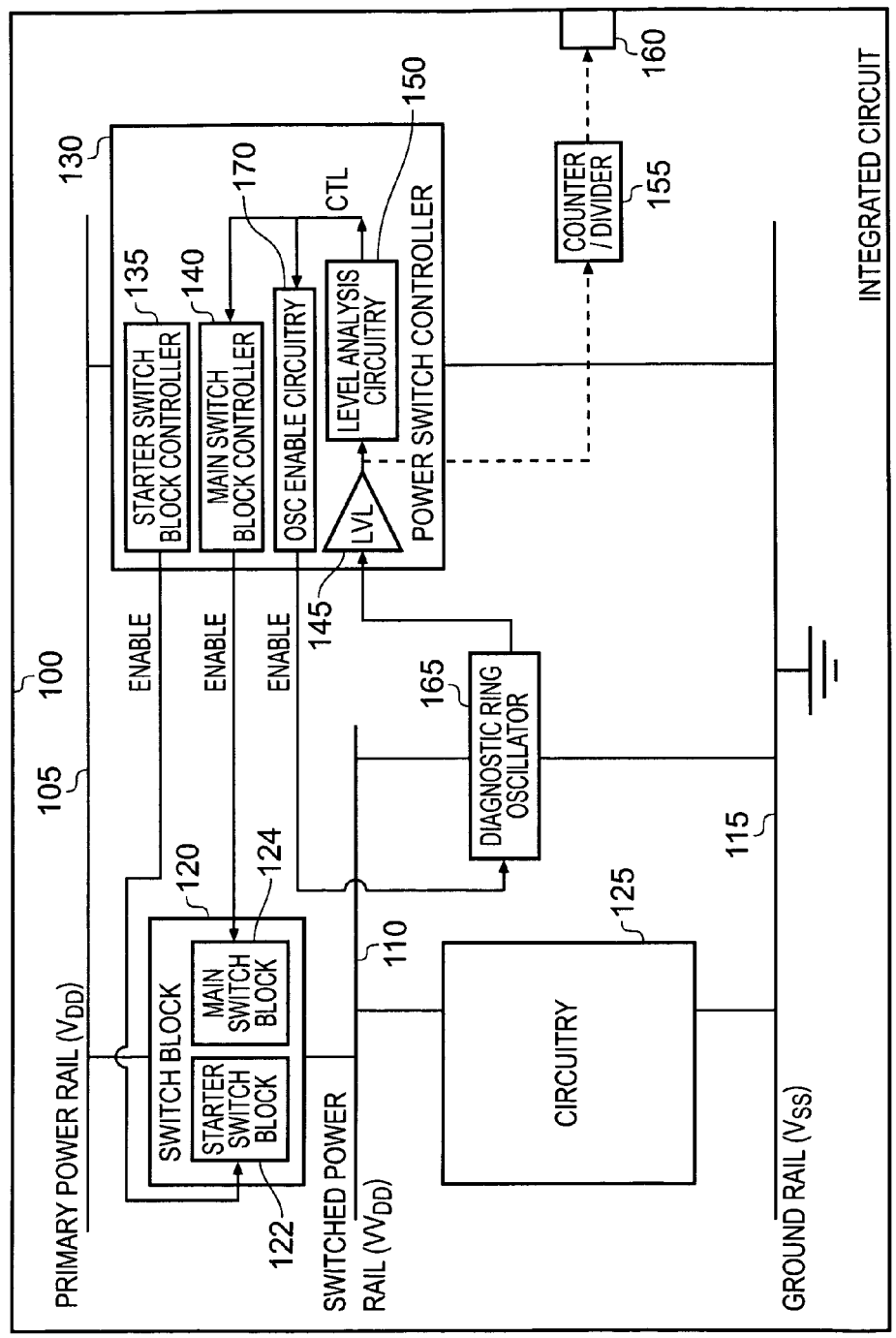
FIG. 1 schematically illustrates an integrated circuit in accordance with one embodiment of the present invention.

FIG. 1 illustrates an integrated circuit 100 in accordance with one embodiment of the present invention. The integrated circuit 100 has circuitry 125 used to perform the data processing operations required by the integrated circuit, with the circuitry 125 being connected to the ground rail 115 and receiving its supply voltage from the switched power rail 110. The switched power rail 110 is coupled to the primary supply voltage rail 105 by the switch block 120, whose operation is controlled by the power switching controller 130.

The switch block 120 may be comprised of a plurality of separate switch block portions which can be separately enabled during a turn on sequence. In one particular embodiment, the switch block 120 includes a starter switch block 122, which itself may consist of a plurality of switch block portions, the starter switch block 122 being enabled during a initial stage of the turn on process so as to pull the voltage on the switched power rail 110 toward the supply voltage on the primary power rail 105. Once the voltage on the switched power rail 110 has reached a predetermined level, a main switch block 124 is then turned on to assist in drawing the voltage on the switched power rail 110 up to the full operating voltage level, whereafter a clock signal can be provided to the circuitry 125 and normal operation of the circuitry 125 can begin.

As shown in FIG. 1, the power switching controller 130 includes a starter switch block controller 135 for issuing an enable signal to the starter switch block 122. In situations where the starter switch block 122 includes a plurality of separate starter switch block portions, the starter switch block controller may issue sequences of enable signals to the relevant starter switch block portions in order to selectively turn on individual switch block portions during the turn on sequence. Similarly, a main switch block controller 140 is provided for supplying an enable signal to the main switch block 124.

In accordance with a first embodiment of the present invention, a diagnostic ring oscillator 165 is provided which takes its power from the switched power rail 110. Oscillator enable circuitry 170 is provided within the power switching controller 130 for providing an enable signal to the diagnostic ring oscillator 165, the diagnostic ring oscillator being a gated ring oscillator so that it need not be permanently turned on whilst the circuitry 125 is active.

As will be described in more detail later, when a turn on sequence is initiated to turn on the switch block 120 and bring the switched power rail 110 up to the supply voltage of the primary power rail 105, the oscillator enable circuitry 170 enables the diagnostic ring oscillator 165, which then begins outputting an oscillating output signal. That oscillating output signal is passed through a level shifter 145 which converts the voltage levels in the switched power rail domain into the voltage levels applicable to the permanently powered domain of the power switching controller 130, the power switching controller 130 being permanently powered by being connected across the primary power rail 105 and the ground rail 115. Level analysis circuitry 150 then analyses change in frequency of the oscillating output signal, the frequency of the oscillating output signal increasing as the voltage on the switched power rail 110 increases during the turn on process. As a result, the oscillating output signal directly transmits a signature that conveys both rise time and actual voltage level of the switched power rail 110, and the level analysis circuitry 150 can hence determine such information about the voltage on the switched power rail 110 through analysis of the frequency change of the oscillating output signal.

In accordance with the embodiment illustrated in FIG. 1, once the frequency reaches a certain level, the level analysis circuitry 150 issues a control signal to the main switch block controller 140 to cause the main switch block controller to turn on the main switch block 124 to complete the turn on process. At this point, the control signal can also be used as an input to the oscillator enable circuitry 170 to cause. the diagnostic ring oscillator to be disabled, since the output from the diagnostic ring oscillator no longer needs to be analysed.

Optionally, the diagnostic ring oscillator 165 can also be turned on during the turn off period when the switch block 120 is turned off to decouple the switched power rail 110 from the primary power rail 105. During this time, the voltage on the switched power rail 110 will drop towards ground, and the level analysis circuitry 150 can determine the rate of that drop and the actual voltage level on the switched power rail 110 through analysis of the oscillating output signal. This can later be used to influence the turn on procedure when it is desired to turn the circuitry 125 back on by reconnecting the switched power rail 110 to the primary power rail 105. In particular, depending on what voltage level the switched power rail 110 is at the time the turn on sequence needs to be performed, this may influence how the turn on procedure is performed so as to most efficiently bring the switched power rail 110 back up to the voltage of the primary power rail 105. For example, if the voltage on the switched power rail 110 has not dropped too far, it may merely be necessary to turn the main switch block 124 back on without needing to employ the starter switch block 122. Alternatively, the starter switch block 122 may still be needed, but the actual sequence by which the component starter switch block portions are turned on may be altered.

In addition to the on-chip analysis performed by the level analysis circuitry 150, it is possible for some off-chip analysis to be performed based on the oscillating output signal, for example for diagnostic purposes. As shown by the dotted line in FIG. 1, the oscillating output signal may be routed via the level shifter 145 to a pad 160 enabling the signal to be passed off chip. Often the frequency of the signal may be too high to pass off chip via the pad 160, and in that case a counter/divider circuit 155 can be used for effectively reducing the frequency of the signal prior to it being passed off-chip. Such a process may enable diagnostic waveform transmission for high speed waveform capture or frequency sweep analysis (for later analysis or real-time measurement respectively).

Figure 2:
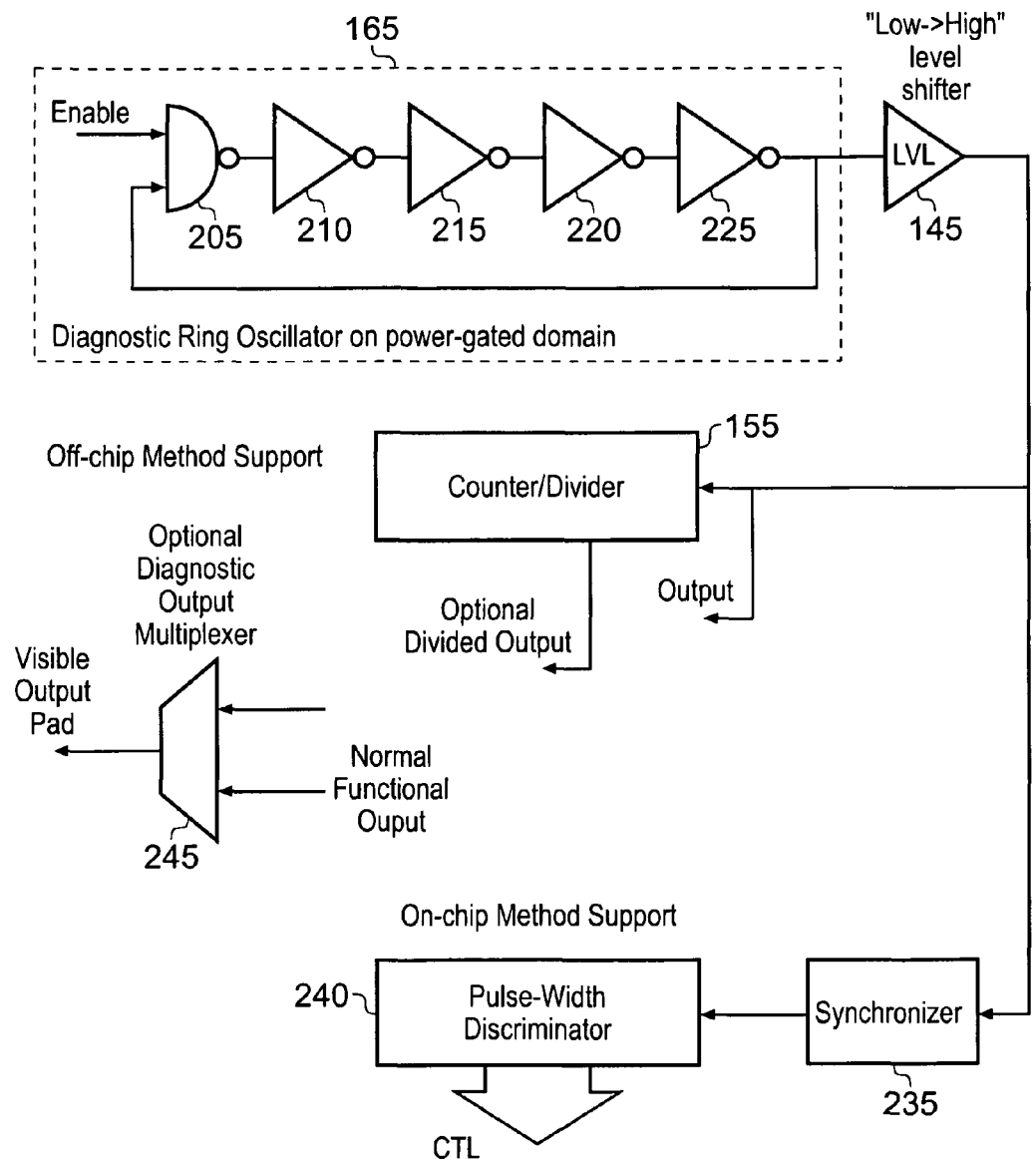
FIG. 2 illustrates in more detail components that can be used to analyse the output from the diagnostic ring oscillator in accordance with the embodiment of FIG. 1.
Figure 3:
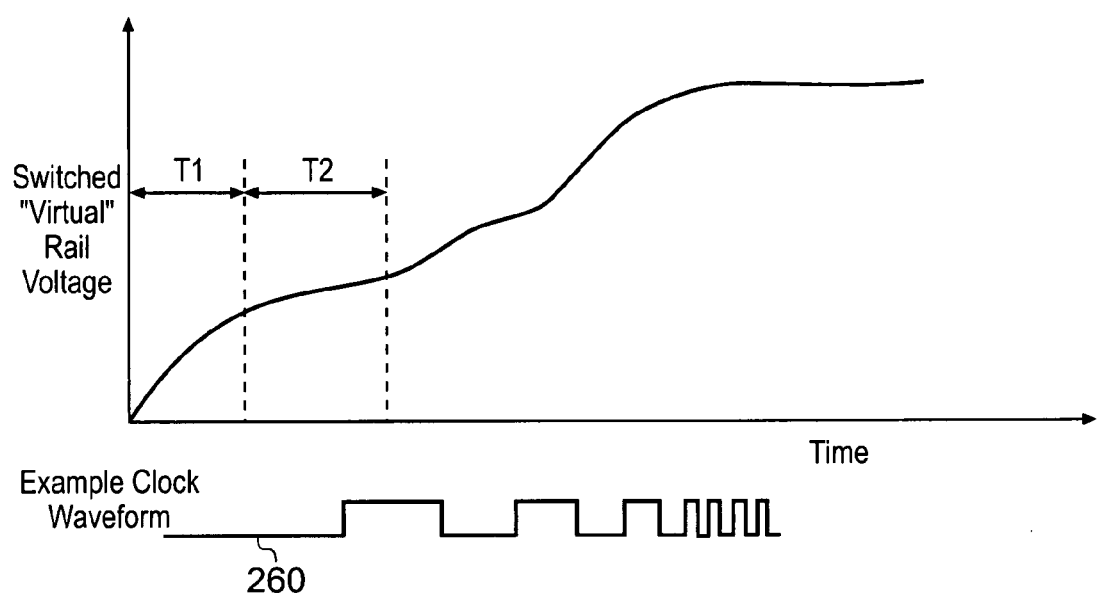
FIG. 3 illustrates how the frequency of the oscillating output signal from the diagnostic ring oscillator of the embodiment of FIG. 1 varies with the voltage on the switched power rail in accordance with one embodiment of the present invention.

FIG. 2 is a diagram schematically illustrating both on-chip and off-chip mechanisms that can be used to analyses the output from the diagnostic ring oscillator 165. The diagnostic ring oscillator includes a series of inverters 210, 215, 220, 225, along with a NAND gate 205 receiving both the output from the final inverter 225 and the enable signal provided by the oscillator enable circuitry 170. Once enabled, the diagnostic ring oscillator will produce an oscillating output signal whose frequency varies with the voltage on the switched power rail 110, as is schematically shown in FIG. 3 where the waveform 260 represents schematically the oscillating output signal that may be output by the diagnostic ring oscillator as the voltage on the switched power rail increases over time.

Once the oscillating output signal has been passed through the level shifter 145, it can be routed directly off-chip via the pad 160, or alternatively can be routed via the counter/divider circuit 155 to produce a divided output signal of a lower frequency. A dedicated pad 160 may be provided for taking this signal off-chip, or alternatively the pad may be shared with an existing pad used for another purpose. In this latter case, a multiplexer 245 may be provided for either routing out the normal functional output to be passed to the pad 160 (which may for example be trace output produced by an on-chip trace module), or alternatively to output the oscillating output signal from the diagnostic ring oscillator.

As also shown in FIG. 2, the level analysis circuitry 150 of FIG. 1 may in one embodiment include a synchronizer 235 and a pulse-width discriminator circuit 240. The operation of these two components is illustrated schematically by the timing diagram of FIG. 5. As can be seen from the ring oscillator signal, the frequency of the ring oscillator output increases over time during the turn on period. The ring oscillator output signal is subjected to three synchronization sampling steps within the synchronizer 235. The synchronizer then produces a rising edge detect signal which is set high when the sync 2 signal is high and the sync 3 signal is not high, i.e. is set high for one clock period per rising edge of the ring oscillator output signal.

The pulse width discriminator 240 maintains a slot count counting the number of clock periods that elapse between rising edge detect signals. When the rising edge detect signal goes high, this is used to re-initialise the slot count in the next clock period, and is also used to sample the current slot count value into a period register during the next clock cycle. Hence, as can be seen from the example illustrated in FIG. 5, the period register has its contents changed from twelve, then to nine, and then to six.

Figure 5:
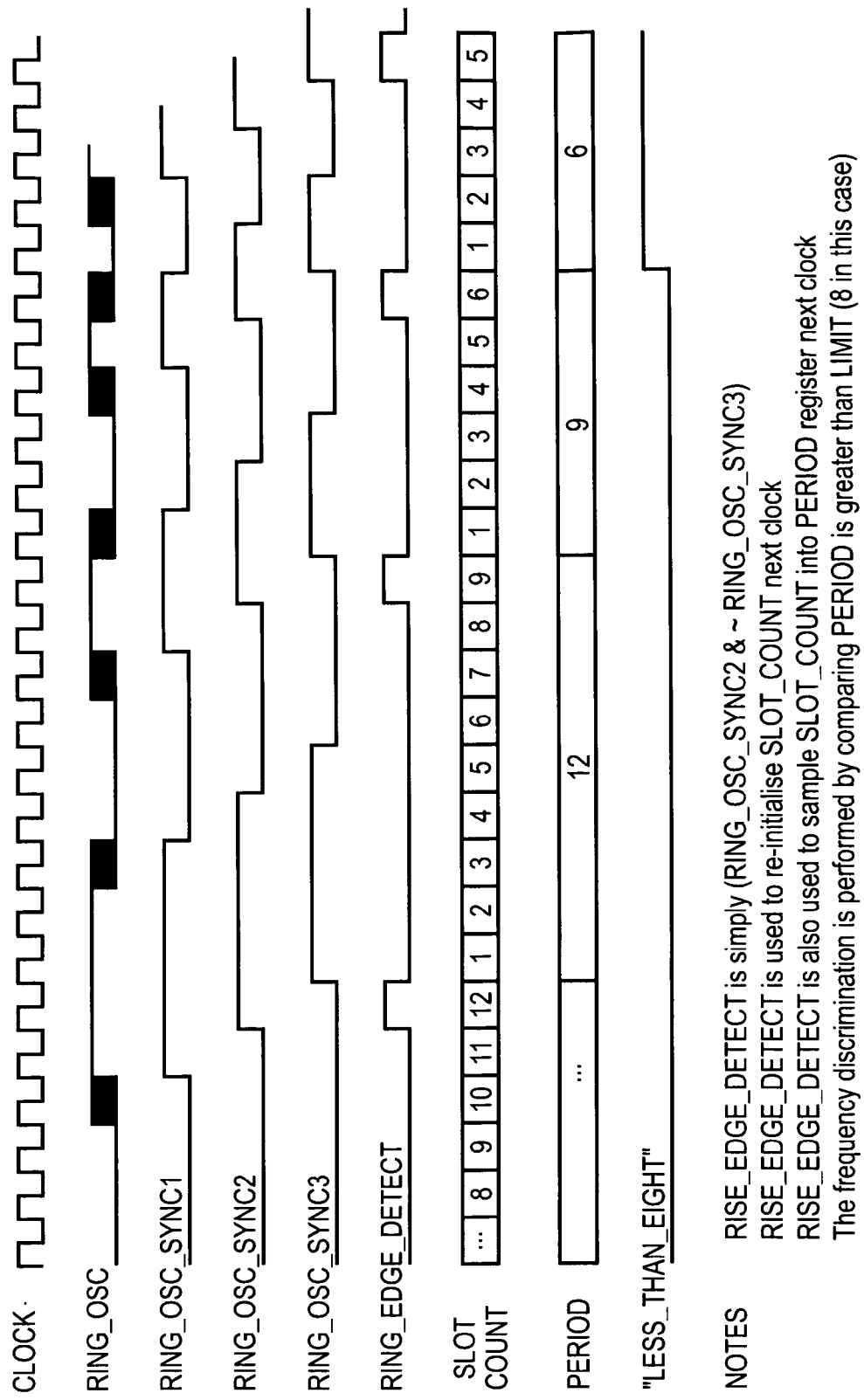
FIG. 5 is a timing diagram schematically illustrating the analysis performed by the level analysis circuitry of FIG. 1 in accordance with one embodiment of the present invention.

Frequency discrimination is then performed within the pulse width discriminator 240 by comparing the contents of the period register with a predetermined value, in the example of FIG. 5 this value being eight. Once the value in the period register drops below the predetermined value, a control signal is set high (in FIG. 5 this being shown as a "less_than_eight" signal), and this control signal is output to the main switch block controller 140 and the oscillator enable circuitry 170. When the control signal goes high, the main switch block controller 140 turns on the main switch block 124, and the oscillator enable circuitry 170 disables the diagnostic ring oscillator 165.

Figure 4:
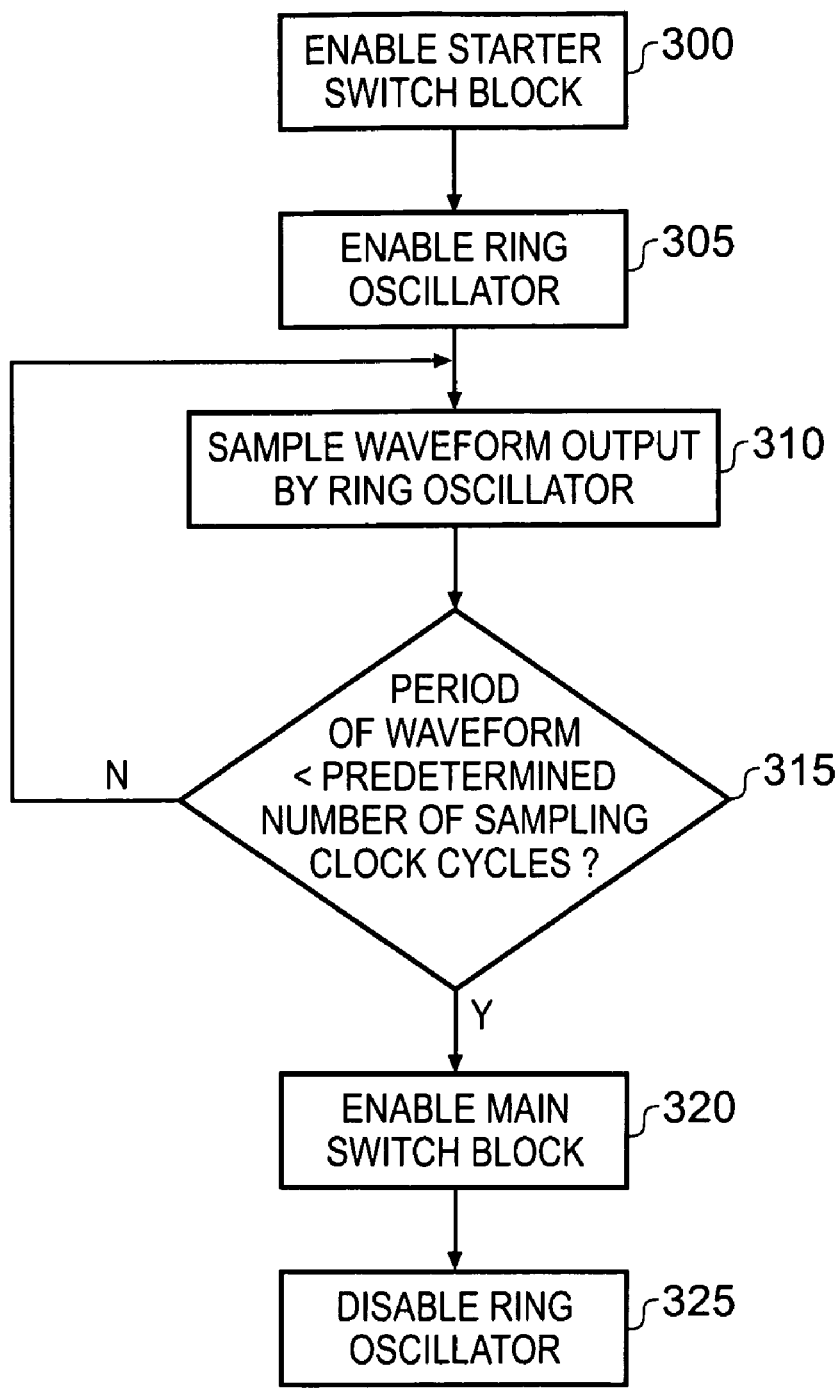
FIG. 4 is a flow diagram illustrating an analysis operation performed using the circuitry of FIG. 1 in accordance with one embodiment of the present invention.

FIG. 4 is a flow diagram illustrating the steps performed to control the power switching using the circuitry of FIG. 1 in accordance with one embodiment. At step 300, the starter switch block is enabled by issuing an enable signal from the controller 135, and at step 305 the diagnostic ring oscillator 165 is enabled by issuing an enable signal from the oscillator enable circuitry 170. It will be appreciated that while steps 300 and 305 have been shown sequentially, these steps can be performed in parallel.

At step 310, the waveform output by the ring oscillator is sampled using the approach discussed earlier with reference to FIG. 5, whereafter at step 315 it is determined whether the period of the waveform is less than the predetermined number of sampling clock cycles (in the example of FIG. 5 that predetermined number being eight). If not, the process returns to step 310 where the waveform continues to be sampled and the comparison of step 315 is re-performed.

Once at step 315 it is determined that the period of the waveform is less than the predetermined number of sampling clock cycles, then at step 320 the main switch block is enabled by issuing an enable signal from the controller 140, and at step 325 the ring oscillator 165 is disabled by de-asserting the enable signal from the oscillator enable circuitry 170. Steps 320 and 325 are in one embodiment performed in parallel.

Often the starter switch block will consist of a plurality of switch block portions which are turned on in sequence during the turn on operation. In addition to, or instead of, using the waveform output by the ring oscillator to determine when to enable the main switch block as discussed above with reference to FIG. 4, the waveform output can be used to control how the individual switch block portions of the starter switch block are used.

For example, during the turn on operation when the starter switch block is being used, the change in frequency of the ring oscillator(s) could be used to track the rate at which the voltage on the switched power rail is rising, i.e. to track the dV/dt through the change in frequency of the oscillator output, and to then control the use of the individual switch block portions of the starter switch block such that the rate of change in voltage of the switched power rail is maintained as desired.

For example, considering the earlier mentioned FIG. 3, if the rate of change in voltage in timing window T1 reflects in a change in frequency of the oscillator that is greater than the expected change in frequency, then on detecting that condition a corrective control could be made to reduce the rate at which the switched power rail voltage is rising by reducing the number of switch block portions that are enabled (resulting in a reduction in rate of voltage change as shown in period T2).

The inverse could also be applied, such that a poor rise in the voltage of the switched power rail could be compensated for by increasing the number of switch block portions that turn on.

Whilst the above embodiment has been described in relation to a header switch block coupling the primary power supply rail 105 to the switched power rail 110, the same techniques can also be applied in connection with a footer switch block coupling the circuitry 125 to the ground rail 115 via a switched ground rail.

Figure 6:
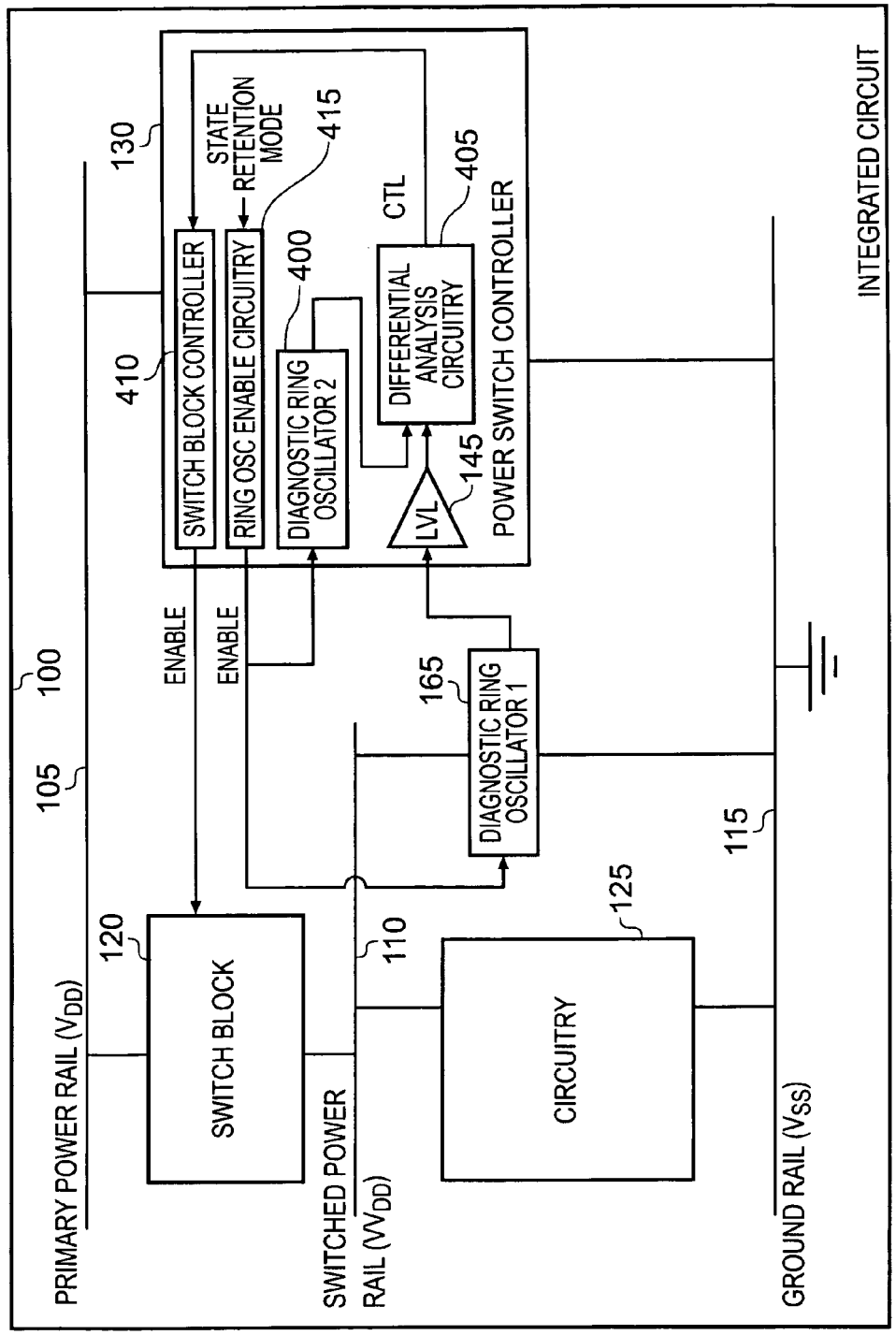
FIG. 6 schematically illustrates an integrated circuit in accordance with a second embodiment of the present invention.

FIG. 6 illustrates an integrated circuit in accordance with an alternative embodiment of the present invention, where instead of determining the absolute frequency of the oscillating output signal with reference to a system clock signal, a relative frequency of the oscillating output signal is determined by comparison with an additional diagnostic ring oscillator circuit. In particular, as shown in FIG. 6, a second diagnostic ring oscillator 400 is provided which is powered from the primary power rail 105. In this embodiment, the diagnostic ring oscillator 400 is considered to be part of the power switching controller 130, but it may alternatively be considered as a separate component to the power switching controller. Ring oscillator enable circuitry is provided for supplying an enable signal to both ring oscillators 165, 400, with a switch block controller 410 then being used to provide an enable signal to the switch block 120. As with the example of FIG. 1, the switch block 120 may actually consist of a starter switch block and a main switch block, in which case the switch block controller 410 will have separate controllers for the separate switch blocks. However, in the embodiment of FIG. 6, the details of the construction of the switch block 120 is not relevant.

In accordance with the example of FIG. 6, the level analysis circuitry of FIG. 1 is replaced with differential analysis circuitry 405 which receives both the oscillating output signal from the second ring oscillator 400 and the oscillating output signal from the diagnostic ring oscillator 165 as modified by the level shifter 145.

In accordance with the embodiment shown in FIG. 6, the power switching controller 130 supports a state retention mode of operation where the switch controller 130 modulates conduction through the switch block 120 to maintain the switched power rail at an intermediate voltage level within a predetermined voltage range. This enables the circuitry 125 to retain state signal values using a lower voltage difference than would be acceptable during the normal operating mode of the circuitry 125 when it is required to perform its intended processing activity. This enables static power consumption (leakage) to be reduced without the need to employ additional balloon latches, and also enables a relatively rapid return to the active processing state when it is subsequently desired to resume processing within the circuitry 125, since the intermediate voltage level will be at a higher voltage level than if the circuitry had instead been turned completely off.

Since the frequency of the oscillating output signal from the second diagnostic ring oscillator 400 is indicative of the voltage on the primary voltage rail 105, and the frequency of the oscillating output signal from the first ring oscillator 165 is indicative of the voltage on the switched power rail 110, the differential analysis circuitry 405 can monitor the voltage difference between the primary power rail 105 and the switched power rail 110 and control the modulation dependent on that analysis. This process will be described in more detail with reference to FIG. 7.

Figure 7:
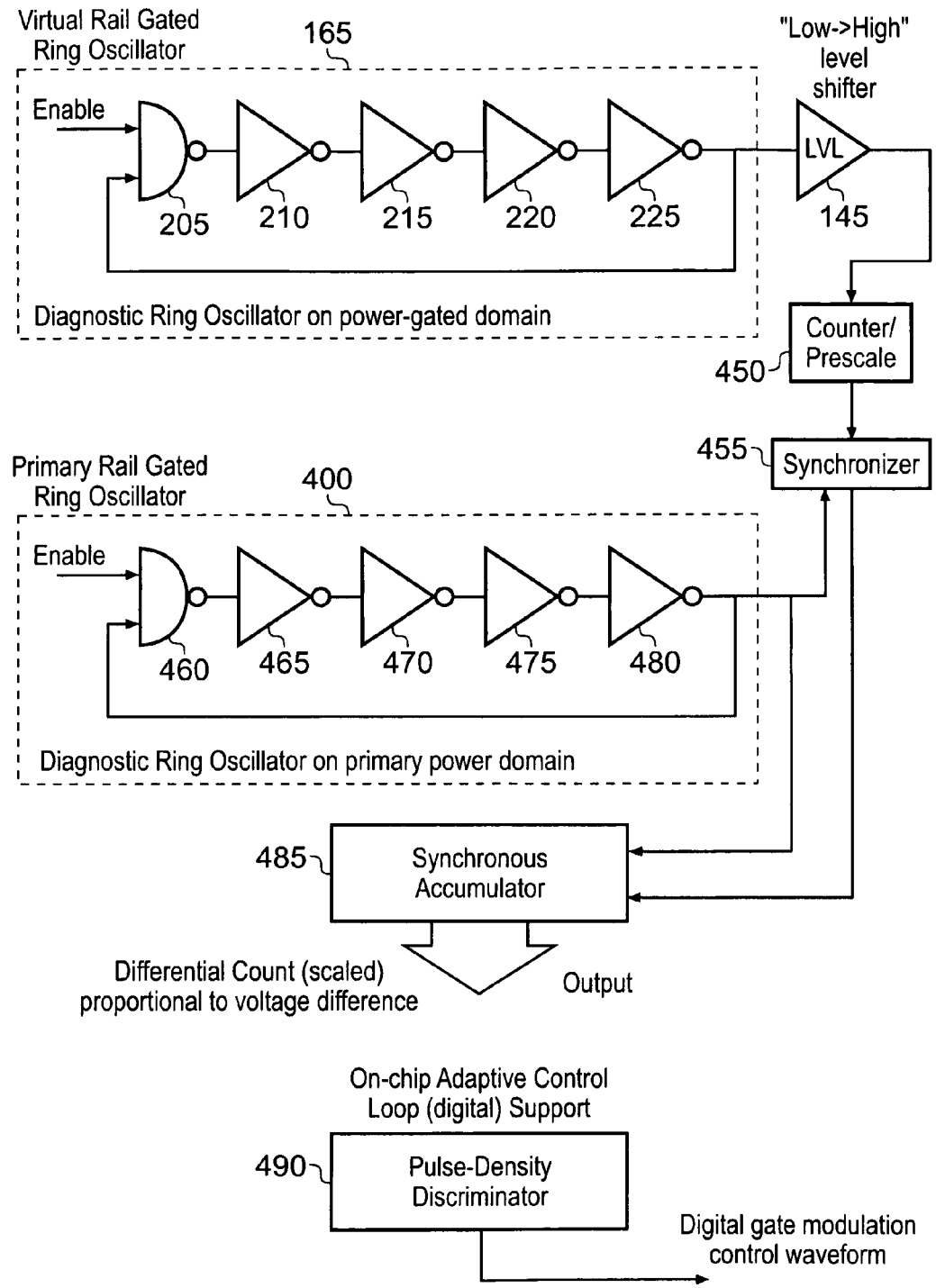
FIG. 7 schematically illustrates the components used to perform differential analysis between the outputs of the two ring oscillators of FIG. 6 in accordance with one embodiment of the present invention.
Figure 9:
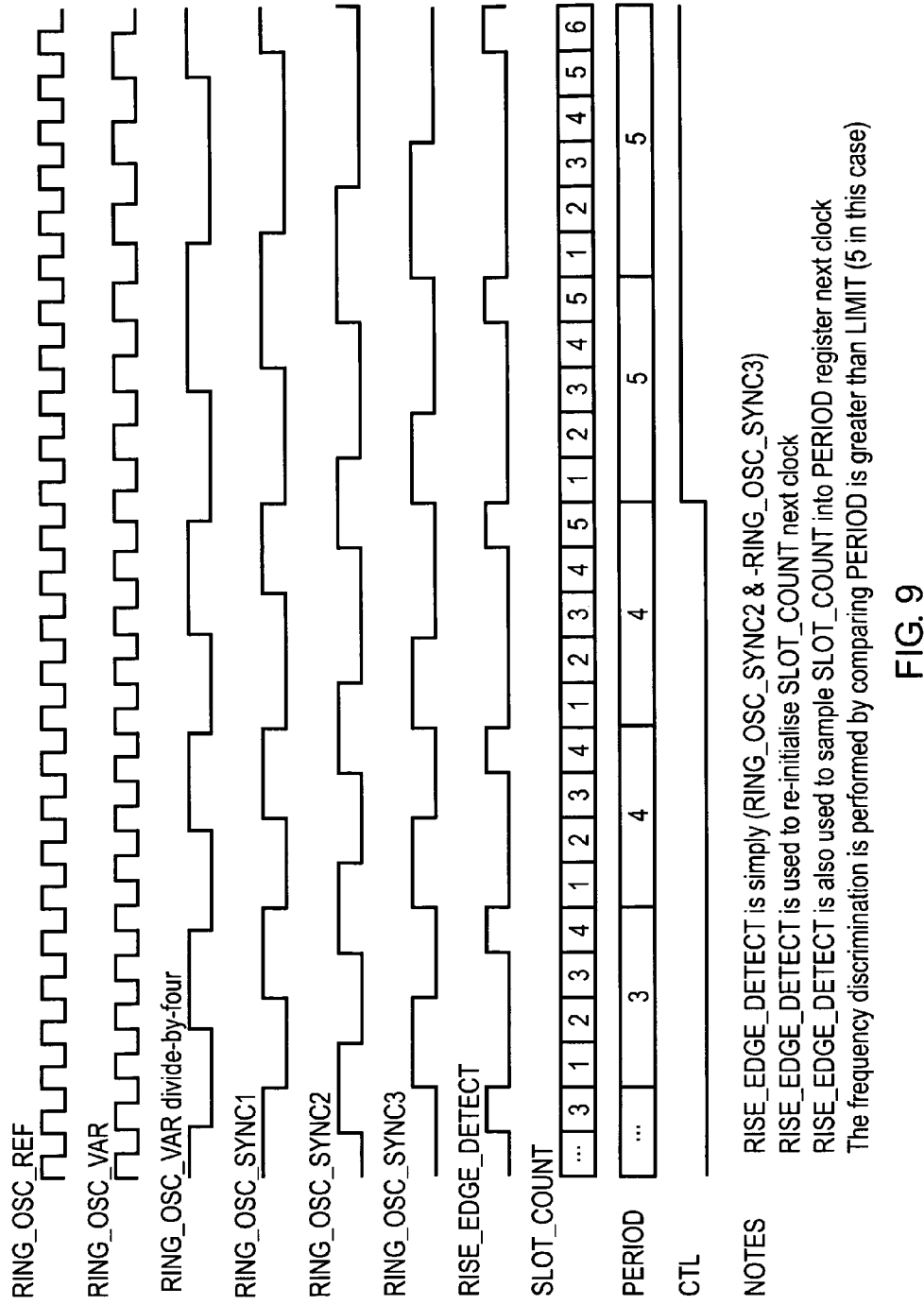
FIG. 9 is a timing diagram illustrating the analysis performed by the differential analysis circuitry of FIG. 6 in accordance with one embodiment of the present invention.

As shown in FIG. 7, the second ring oscillator 400 of one embodiment is constructed in an identical manner to the first ring oscillator 165, and accordingly includes four inverters 465, 470, 475, 480, along with a NAND gate 460 arranged to receive the output from the last inverter 480 and the enable signal from the ring oscillator enable circuitry 415. When the state retention mode is entered, both ring oscillators are enabled and begin outputting their respective oscillating output signals. The differential analysis circuitry 405 of FIG. 6 in the embodiment of FIG. 7 consists of four components, namely a counter/prescaler 450, a synchronizer 455, a synchronous accumulator 485, and a pulse-density discriminator 490. The operation of these particular components is illustrated schematically by the timing diagram of FIG. 9. The oscillating output signal from the second ring oscillator 400 provides the ring oscillator reference signal shown in the first line of FIG. 9, whilst the output from the first ring oscillator 165 as modified by the level shifter 145 provides the variable ring oscillator signal shown in the second line of FIG. 9. The counter/prescaler 450 divides the output from the first ring oscillator 165 so as to enable a more precise comparison between the two oscillating output signals. In the example of FIG. 9, the counter/prescaler performs a divide by four function, although in practice it may be appropriate to perform larger divisions such as divide by sixteen. As with the earlier example of FIG. 5, the oscillating signal is then subjected to three synchronizing stages in the synchronizer 455 to synchronize the divided output from the first ring oscillator 165 with the rising edge of the reference oscillating signal produced by the second ring oscillator 400. The rise edge detect signal is then produced in the same manner as discussed with reference to FIG. 5, i.e. being set for one clock period whilst the second synchronization signal is high and the third synchronization signal is low. This signal is then output to the synchronous accumulator 485 which maintains a slot count identifying the number of reference cycles that have elapsed between the rise edge detect signals. The rise edge detect signal when set is used to reinitialize the slot count in the next clock cycle, and is also used to sample the slot count value into the period register in the next clock cycle. The contents of the period register are then output as a differential count value from the synchronous accumulator 485 to the pulse-density discriminator 490.

In a typical embodiment, the pulse-density discriminator will maintain two predetermined values, namely a maximum count value and a minimum count value. In the example illustrated in FIG. 9, the maximum count value is four, and when the period value exceeds that maximum count value, a control signal is set which is routed to the switch block controller 410 to cause the switch block 120 to be turned on. This will cause the voltage on the switched power rail 110 to rise and accordingly the frequency of the ring oscillator 165 to increase. As a result, over time the period value will again begin to reduce and when that value becomes less than the minimum count value, the control signal will be reset to cause the switch block controller 410 to de-assert the enable signal to the switch block, and accordingly turn the switch block 120 off. This process can be continued throughout the state retention mode to modulate the enable signal to the switch block in order to maintain the switched power rail 110 at an intermediate voltage within a predetermined range.

Figure 8:
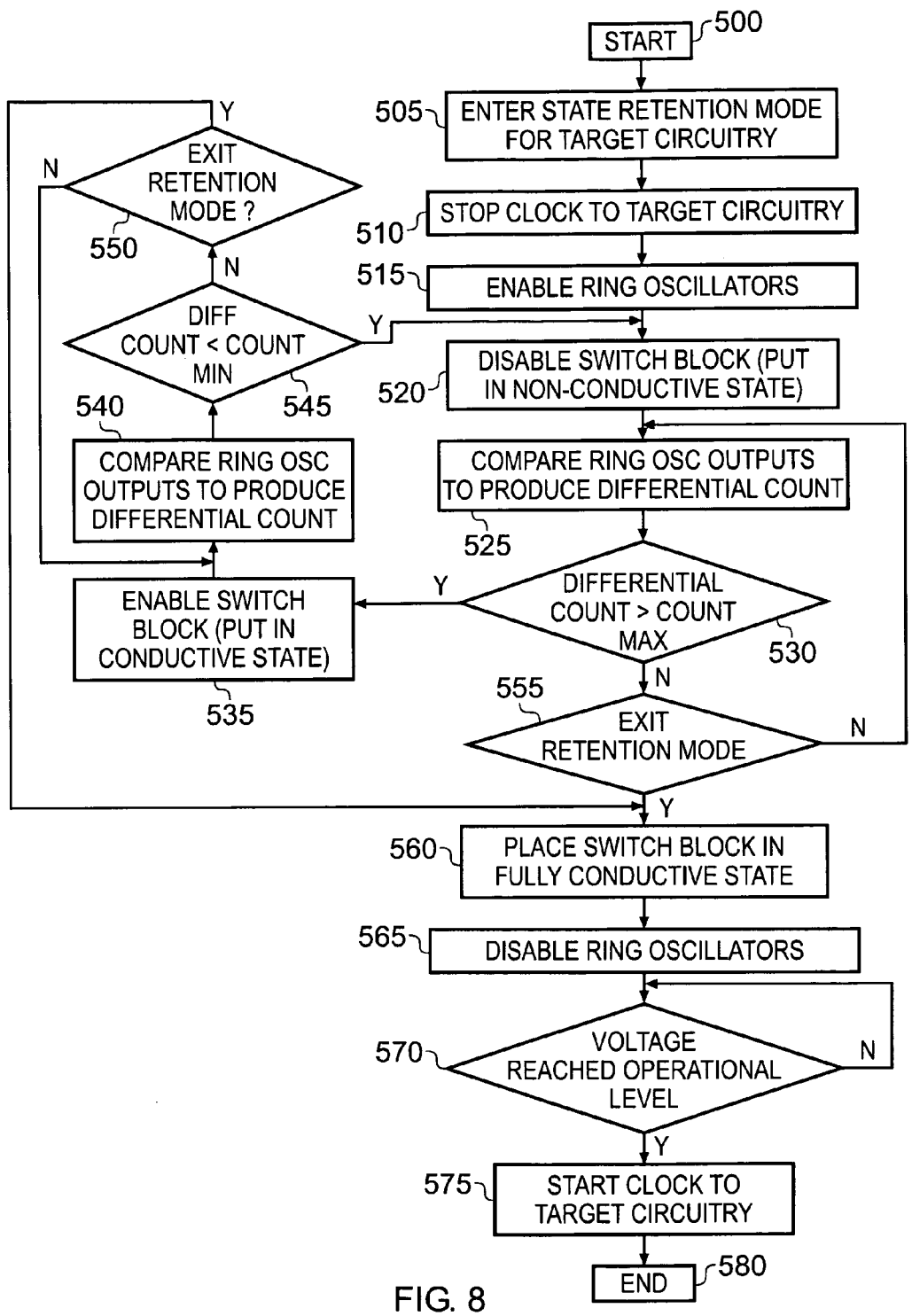
FIG. 8 is a flow diagram illustrating a feedback control process which can be performed using the circuitry of FIG. 6 in order to modulate connection of a main power rail to a switched power rail in accordance with one embodiment of the present invention.

FIG. 8 is a flow diagram illustrating in more detail the state retention mode of operation. At step 500, the process starts, whereafter at step 505 the state retention mode for the target circuitry 125 is entered. At step 510, the clock to the target circuitry is stopped, and at step 515 the two ring oscillators 165, 400 are enabled by issuing an enable signal from the ring oscillator enable circuitry 415. At step 520, the switch block 120 is then disabled, i.e. put in the non-conductive state, by de-asserting the enable signal from the switch block controller 410.

Thereafter, at step 525, the outputs from the two ring oscillators are compared to produce the differential count value discussed earlier whereafter at step 530 it is determined whether the differential count value is greater than the maximum count value. If not, and provided the retention mode is not being exited at step 555, the process loops back to step 525 to continue the comparison process.

If at step 530 it is determined that the differential count is greater than the maximum count value, then the process branches to step 535, where the switch block 120 is enabled by issuing an enable signal from the switch block controller 410, to thereby place the switch block 120 into the conductive state. Thereafter, at step 540, the outputs from the two ring oscillators are compared to produce the differential count value, and then at step 545 it is determined whether the differential count is less than the minimum count value. If not, and assuming the retention mode is not being exited at step 550, the process returns to step 540 to continue the comparison process. Once it is determined that the differential count value is now less than the minimum count value, the process branches back to step 520 to disable the switch block 120.

Once the retention mode is exited at either step 555 or at step 550, the process proceeds to step 560 where the switch block is placed into its fully conductive state. At step 565, the ring oscillators are then disabled as they are no longer required, and at step 570 it is determined whether the voltage on the switched power rail 110 has reached the required operational level. Once it has, the clock to the target circuitry 125 is started, and normal operation is resumed, whereafter the process ends at step 580.

Whilst in the example implementation of FIG. 8, both ring oscillators are maintained in the enable state for the entirety of the state retention mode, in alternative embodiments it may not be necessary for the ring oscillators to be enabled for the entire period, and instead it may be sufficient for them to be enabled periodically to perform the required comparisons, thereby reducing power consumption.

As an alternative use for the ring oscillators in FIG. 6, they may be arranged to be enabled during the normal operational mode of the circuitry 125 in order to produce diagnostic data concerning the operation of the switch block 120. In particular, during normal operation, there will be a slight potential difference between the primary power rail 105 and the switched power rail 110, due to the voltage drop across the switch block 120. During normal operation, any difference in frequency between the oscillating output signals from the two ring oscillators 165, 400 will indicate the value of this voltage drop. This can be useful for diagnostic purposes. For example, if this voltage drop is higher than expected, it may indicate some malfunction of the components within the switch block. Further, such measurements could be used to influence circuit operation. As an example, as the circuit is used more and more, the components within the switch block will be subject to wear, and over time this may lead to the voltage drop across the switch block becoming larger. If the voltage drop exceeds a certain safe level, then this can potentially give rise to a malfunction of the circuitry 125, but such likelihood of malfunction may be reduced by reducing the operating frequency of the circuitry, thereby prolonging the useful life of the circuit. Accordingly, the output from the differential analysis circuitry 405 can be used over time to alter the operating frequency of the integrated circuit, and in particular the circuitry 125, having regards to the voltage drop across the switch block 120.

Figure 10:
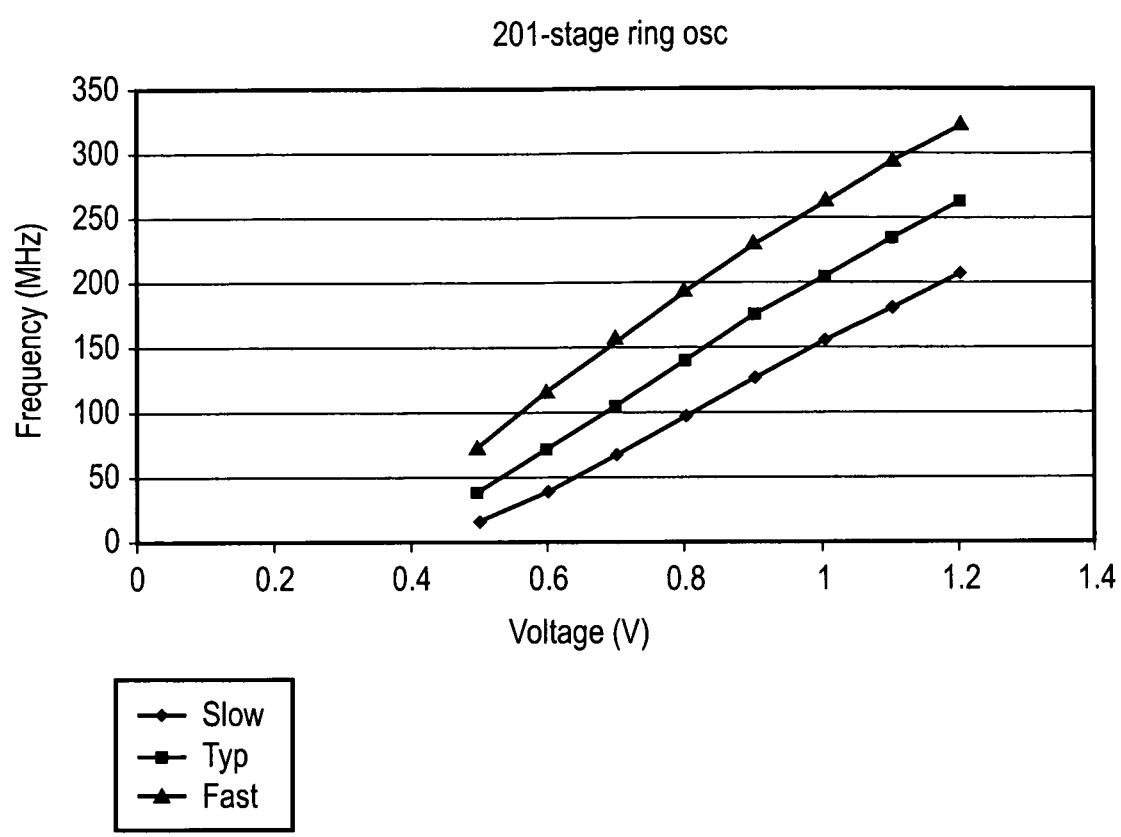
FIG. 10 is a graph schematically illustrating how the frequency of the output signal from a gated ring oscillator varies with its operating voltage for slow, typical and fast circuits.
Figure 11:
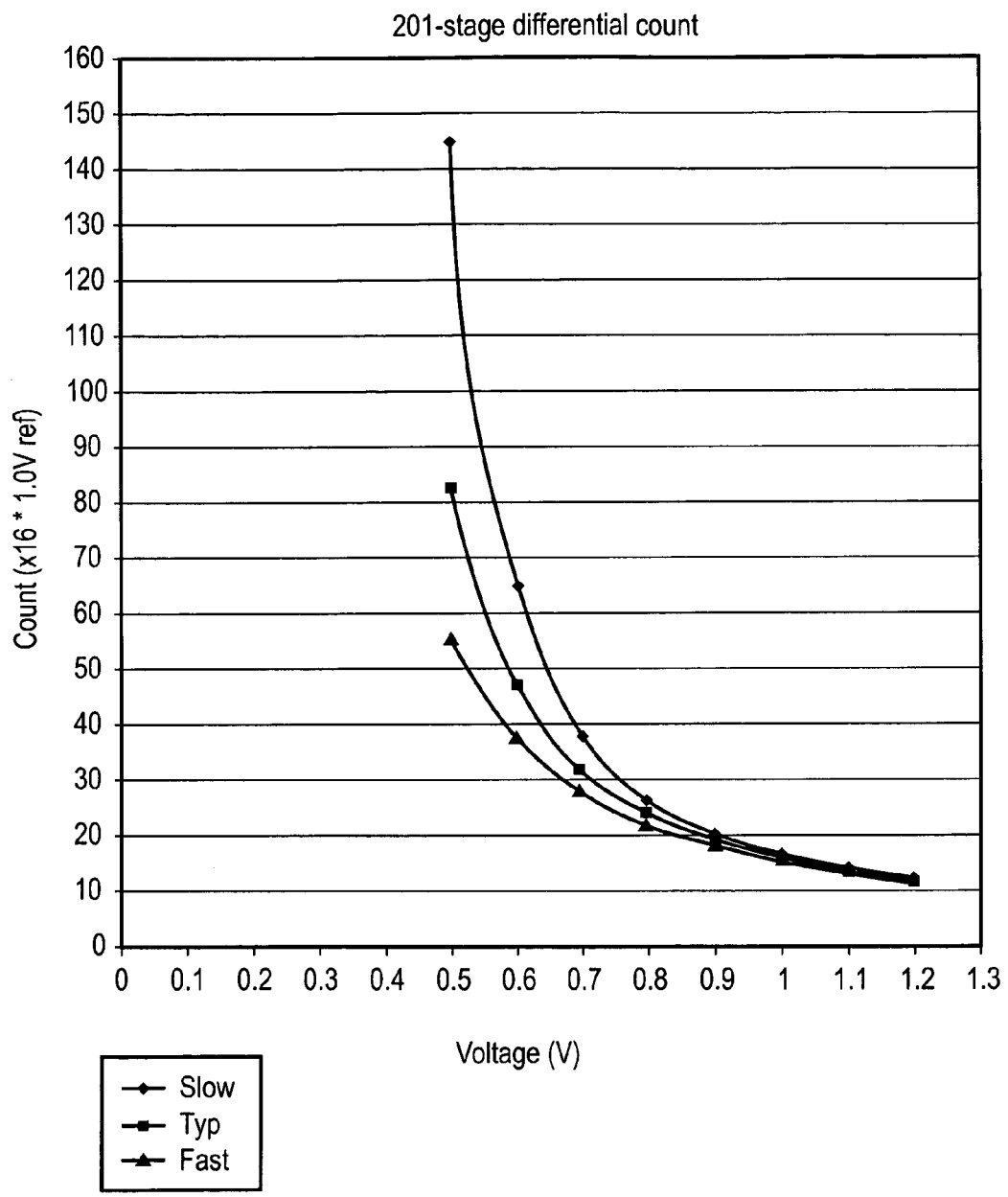
FIG. 11 is a graph illustrating how the differential count value produced by the differential analysis circuitry of FIG. 6 varies in one particular embodiment for slow, typical and fast circuits.

FIGS. 10 and 11 are graphs illustrating how the frequency of the oscillating output signal from the ring oscillator circuits varies with the operating voltage applied to those Ting oscillator circuits. Three lines are shown, which are representative of a slow, typical, and fast circuit, respectively. As is known, in production some circuits end up running faster than other circuits, due to factors such as the quality of the silicon on which the circuits are constructed, and FIG. 10 illustrates the variation in frequencies that may be observed depending on the circuit speed.

FIG. 11 illustrates for the same slow, typical and fast circuits the variation in differential count values that may be produced by the synchronous accumulator 485 for different operating voltages across the first ring oscillator 165. In this example, it is assumed that the normal operating voltage is one volt, at which point both ring oscillators produce oscillating output signals at the same frequency, but due to the output from the ring oscillator 165 being divided by sixteen, this gives rise to a differential count value of sixteen. As the voltage then drops away, the count value varies dependent on the speed of the circuit, as shown by the divergence in the three lines shown in FIG. 11. The maximum and minimum count values used by the differential analysis circuitry can hence be adapted having regards to whether the circuitry is slow, typical or fast, or alternatively the divider can be altered so as to apply a larger division for slower circuits.

From the above description of embodiments of the present invention, it will be seen that such embodiments provide a mechanism where a digital ring oscillator component can be used to indirectly transmit a signature that conveys both rise time for header-switched power, or fall time for footer-switched ground, and/or actual analogue voltage level information that can be analysed on or off chip with standard clocked techniques. The ring oscillator is a relatively simple digital circuit that can be constructed using standard cells and hence is simple and cheap to implement, and can be arranged to consume relatively little power. By using gated ring oscillators, the ring oscillators can also be disabled when not in use so as to reduce power consumption.

In one embodiment, the ring oscillator output is analysed during a turn on or turn off operation of a switch block during a period when the voltage on the switched power rail is not stable so as to essentially allow indirect measurement of the change in voltage over time, along with providing an indication of the actual analogue voltage level. In another embodiment, differential analysis between a ring oscillator coupled to the switched power rail and a ring oscillator coupled to the permanent power rail is performed to provide an indirect measurement of the difference in voltage between the two power rails, this information being useful in a variety of situations. One particular use of such information is in supporting a state retention mode of operation as described earlier with reference to FIGS. 6 to 9. Further details of the operation of such a state retention mode of operation is provided in commonly assigned, co-pending U.S. patent application Ser. No. 11/797,497, the entire contents of which are herein incorporated by reference. Further, for the interested reader, the embodiment description of that U.S. patent application is incorporated herein as Appendix I.

APPENDIX I

Figure 12:
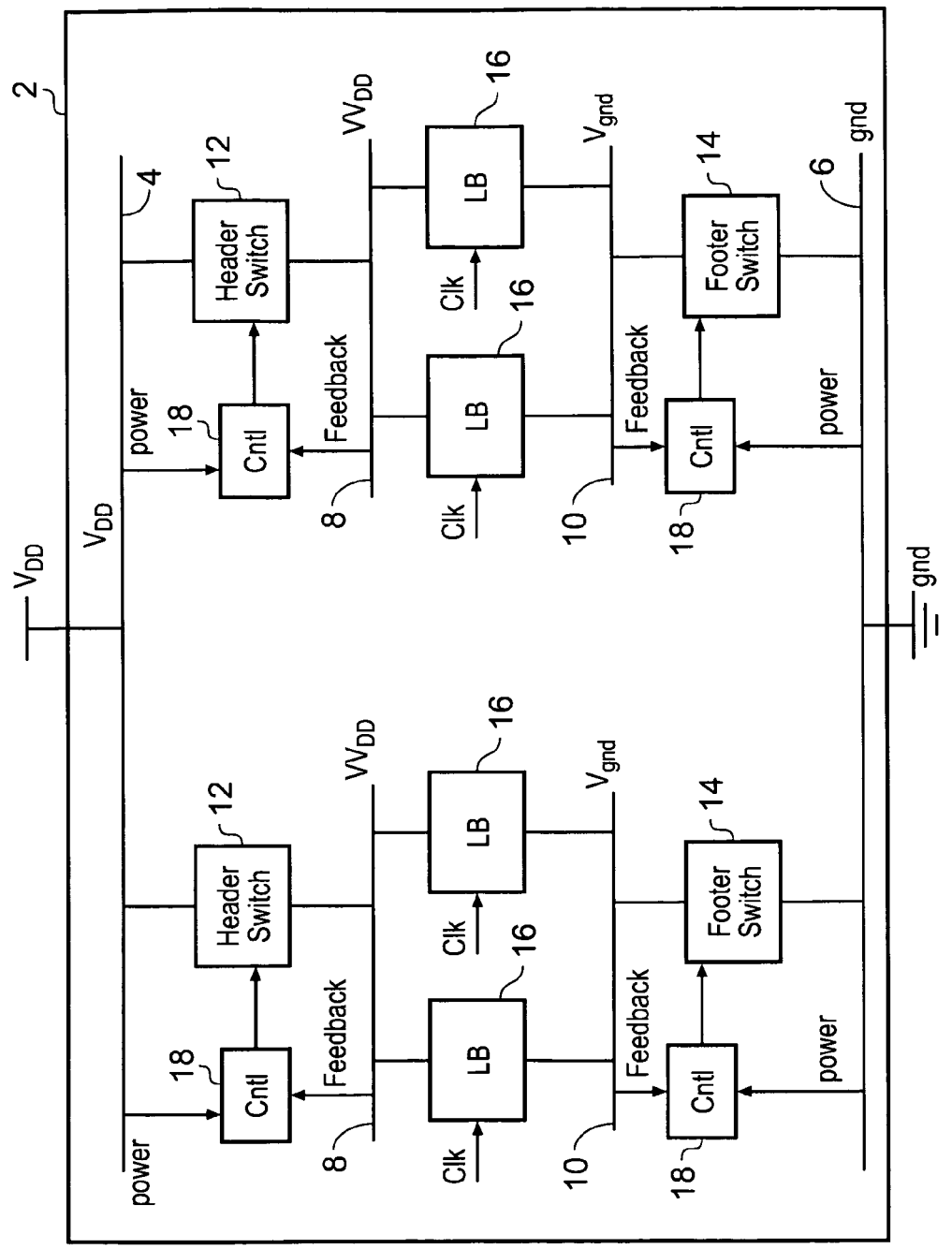
FIG. 12 schematically illustrates an integrated circuit employing main power rails, virtual power rails, header switches and footer switches together with modulation of the connections between the main power rails and the virtual power rails.

FIG. 12 illustrates an integrated circuit 2 including a main supply rail 4, a main ground rail 6, a virtual supply rail 8 and a virtual ground rail 10. Header switches 12 selectively connect the main supply rail 4 to the virtual supply rail 8. Similarly, footer switches 14 selectively connect the main ground rail 6 to the virtual ground rail 10. Logic blocks 16 draw their power supply from the virtual supply rail 8 and the virtual ground rail 10. The logic blocks 16 are clocked with a clock signal clk to perform data processing operations.

The integrated circuit 2 can be formed using different fabrication technologies but the present technique is well suited to systems in which the integrated circuit is formed of CMOS transistors, and more particular MTCMOS transistors. It will be appreciated that the integrated circuit 2 will typically be formed of a large number of functional elements and can take a variety of different forms, such as a microprocessor, a SoC, a memory or other forms of integrated circuit.

Also illustrated in FIG. 12 are switch controllers 18, which are coupled to their respective switches and control these to be either conductive or non-conductive. The switch controllers 18 are also coupled to the respective virtual power rails 8, 10 and are responsive to the voltages thereon to modulate the connection provided by their associated header and footer switches 12, 14 between the main supply rail 4 and the virtual supply rail 8 and between the main ground rail 6 and the virtual ground rail 10. This modulation maintains the virtual rail voltages at intermediate levels compared to the situation in which the switches are either permanently conductive or permanently non-conductive. This modulation can in some embodiments be used to provide a form of dynamic voltage scaling in which the power supply voltage given to the logic blocks 16 is set to an intermediate level necessary to support clocking of that logic block 16 at the currently active clock frequency. Generally speaking, the lower the voltage difference across the logic block 16, then the lower the power consumption therein. This is also true when the logic block 16 is static and the power consumption is due to static leakage currents.

The present technique recognises that when the logic blocks 16 are not clocked, they can be used to hold state signal values without recourse to balloon latches providing a minimum retention voltage is maintained across the logic block 16. This minimum retention voltage will be less than the voltage required for active processing within that logic block 16. Thus, power consumption can be reduced by lowering the voltage difference across the logic block 16 compared with that used when the logic block 16 is active, and yet the state signal values can be maintained as held therein and ready for processing to be restarted. Processing can be restarted by restoring the voltage difference across the logic block 16 to the operational level and then restarting the clock signal. This can be relatively rapid and thus support a rapid switching between a low power retention state and an operational state.

Figure 13:
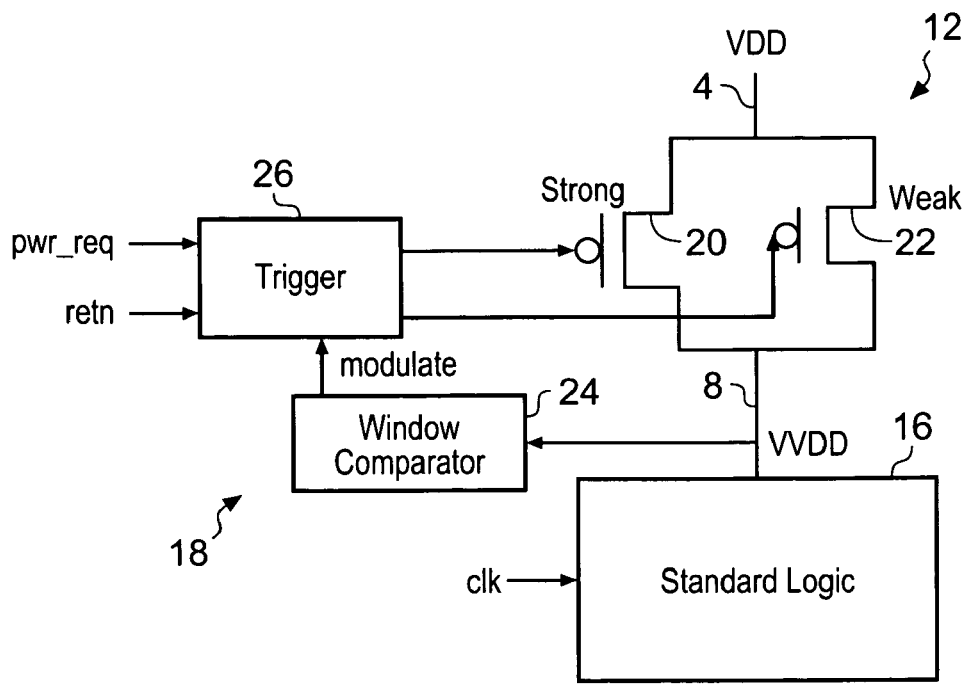
FIG. 13 is a circuit block diagram schematically illustrating one example embodiment of a header switch and switch controller for modulating the connection between a main supply rail and a virtual supply rail.

FIG. 13 illustrates a first example embodiment in which a header switch 12 is subject to modulation control by a controller 18. The header switch 12 is formed of a strong transistor 20, which has a high conductance, and a weak transistor 22, which has a low conductance. When the logic block 16 is in its active state, the strong transistor 20 is switched on to provide a low impedance path between the main supply rail 4 and the virtual supply rail 8 such that the power consumption requirements of the active logic block 16 can be satisfied. When the logic block 16 is to be placed in to its retention mode in which it statically holds state signal values, the clock signal clk thereto is stopped and the controller 18 used to modulate the weak transistor 22 between conductive and non-conductive states. The strong transistor 20 is switched off during this modulation (pulsing) operation. A window comparator 24 is used to determine when the voltage on the virtual supply rail 8 falls below a minimum level or rises above a maximum level. When the virtual supply rail voltage falls below the minimum level, then the weak transistor is switched on. The weak transistor 22 remains switched on until the virtual supply voltage reaches a maximum level at which point the weak transistor 22 is switched off. The leakage current associated with the logic block 16 then gradually discharges the stored charge on the virtual supply rail 8 until the virtual supply rail voltage again falls below the minimum value. The weak transistor 22 is then switched on again to restore the virtual supply rail voltage. In this way, the connection between the main supply rail 4 and the virtual supply rail 8 is modulated on and off via the weak transistor 22 acting under control of the window comparator 24 and the trigger circuit 26. The signal levels defining the lower limit and upper limit of the virtual supply rail voltages are internally generated within the window comparator 24 (such as by suitable voltage divider network).

Figure 14:
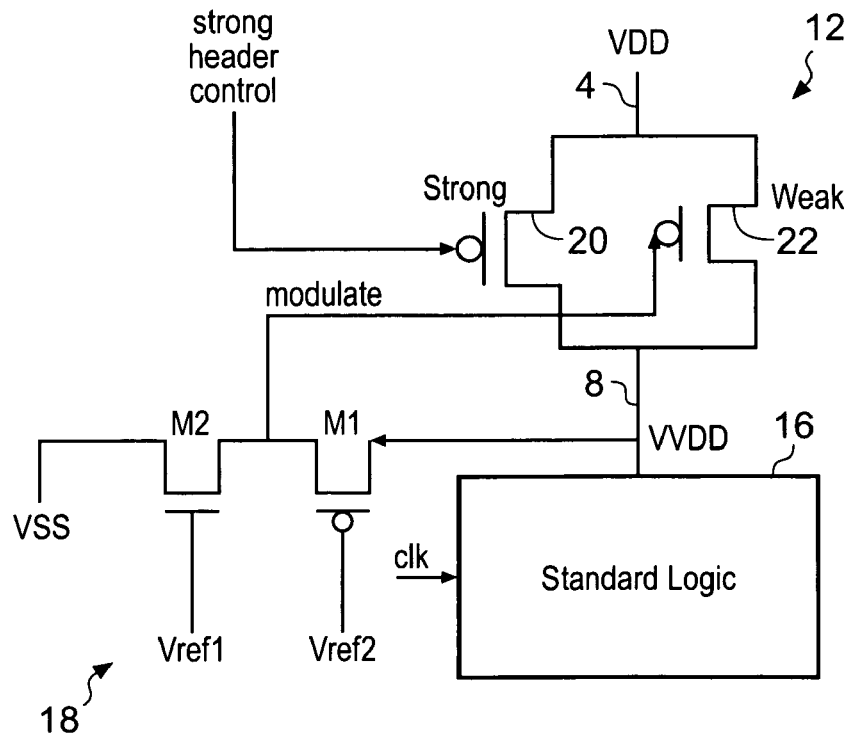
FIG. 14 is a block circuit diagram schematically illustrating a second example embodiment as a variant to that shown in FIG. 13.

FIG. 14 illustrates an alternative embodiment In this embodiment the switch controller 18 is provided by the two transistors M1 and M2 illustrated. These have their gates supplied with the range defining voltages Vref1 and Vref2. The transistors M1 and M2 provide an analogue feedback control of the virtual supply rail voltage to maintain this at an intermediate level sufficient for state signal retention within the logic block 16.

It will be seen in both FIG. 13 and FIG. 14 that the switch controller 18 provides feedback control of the virtual supply rail voltage. Thus, the switch block 16 and its associated switch controller 18 are self-regulating. It will be appreciated that an integrated circuit 2 will typically contain many instances of switch blocks 12, 14, as well as associated controllers 18. Not all of these need use the modulation techniques described herein. It may be that only certain portions of the integrated circuit 2 are appropriate to place into a low power data retention mode, or alternatively it may be that in the low power data retention mode one header switch 12 and/or footer switch 14 can service multiple logic blocks 16 whereas in the active mode individual header and footer switches 12, 14 are necessary due to the higher power requirements.

Figure 15:
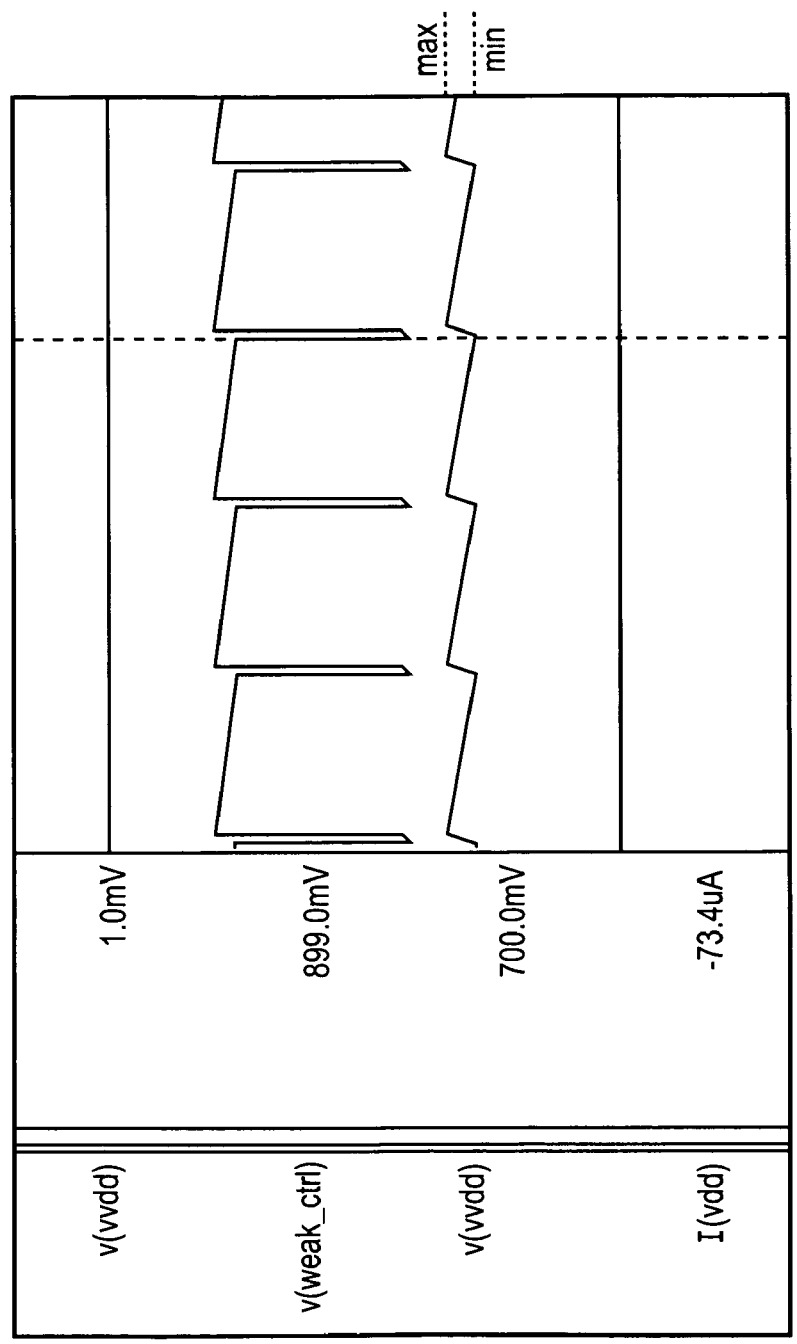
FIG. 15 is a signal diagram illustrating the variation in voltage levels with time in the example embodiment of FIG. 13.

FIG. 15 is a signal diagram schematically illustrating the periodic variation in signal levels associated with the operation of the example embodiment of FIG. 13. The signal v(weak_ctrl) is the signal which controls the switching on and the switching off the weak transistor 22. The weak transistor 22 is switched on (i.e. conductive) when this signal is low. It will be seen that the weak transistor 22 is modulated with a relatively low on duty cycle corresponding to the short periods during which the gate voltage of the weak transistor 22 is drawn low to switch the weak transistor 22 into the conductive state. The signal vvdd (the virtual supply rail voltage) is shown as having a value a little above 700 nv and with a periodic variation. This virtual supply rail voltage gradually decays due to leakage currents through the logic blocks 16 when the weak transistor 22 is switched off. When the weak transistor 22 is switched on, the virtual supply rail voltage is rapidly restored up to its predetermined maximum level. The virtual supply rail voltage thus varies between the minimum and maximum levels illustrated and is maintained in this range. This range of virtual supply rail voltages is above the minimum retention voltage, which is a characteristic of the logic block 16 and corresponds to the minimum voltage at which the logic block 16 will maintain state signal values when unclocked.

Figure 16:
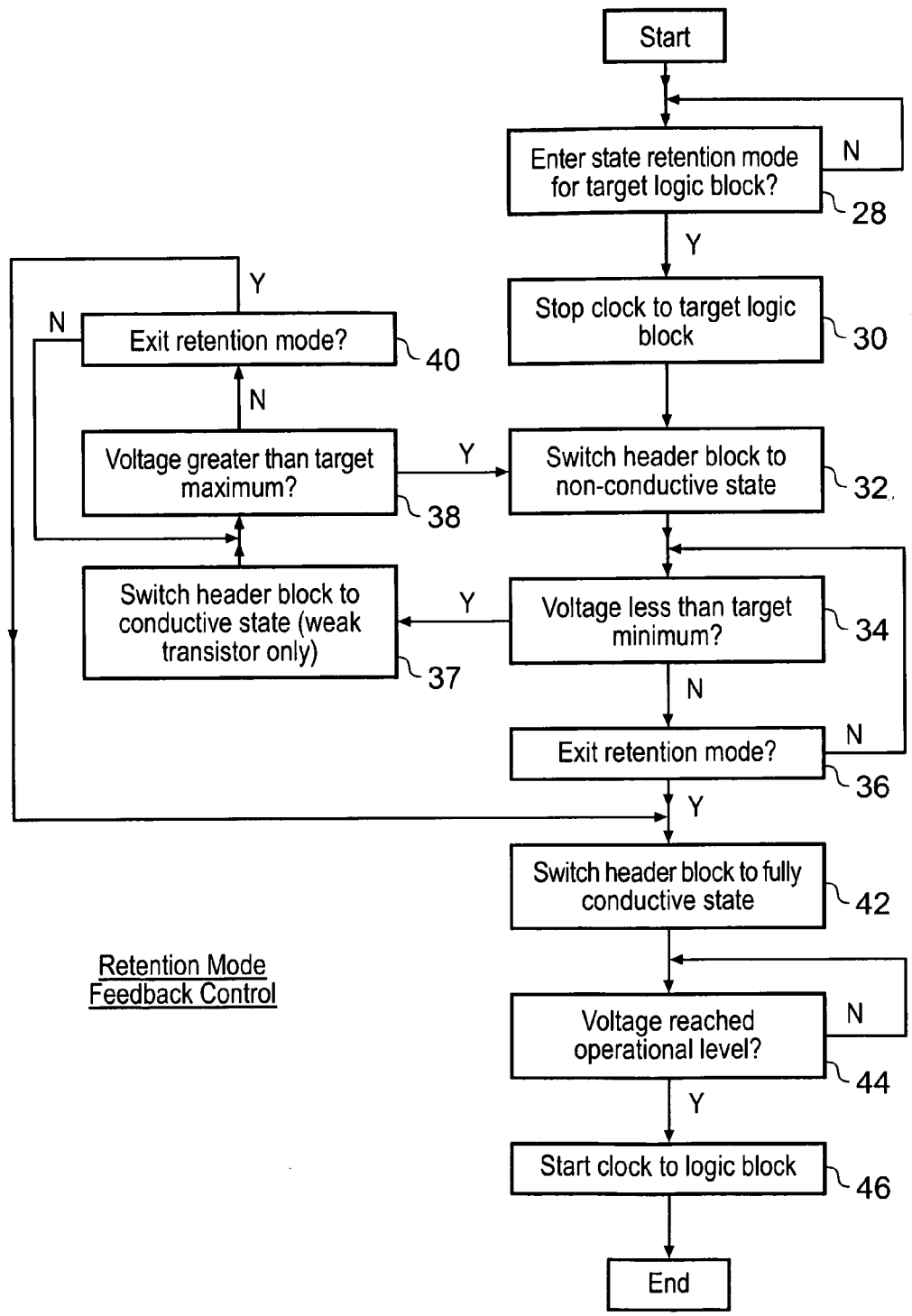
FIG. 16 is a flow diagram schematically illustrating the feedback control which can be used to perform modulation of the connection of a main power rail to a virtual power rail.

FIG. 16 is a flow diagram schematically illustrating the operation of a switch controller 18 in accordance with one example embodiment. It will be appreciated that the flow diagram of FIG. 16 necessarily represents the control as a serial sequence of processing operations. It will be appreciated by those in this technical field that in practice some or all of these operations may be performed in parallel by a circuit implementation. Nevertheless, the flow diagram of FIG. 16 is useful in understanding the operation of the switch controller 18.

At step 28 the switch controller 18 waits until a signal is received indicating that the state retention mode is to be entered (retn). When this signal is received, then processing proceeds to step 30 at which the clock signal clk is stopped and the clock signal levels held static. The static nature of the processing logic of the logic blocks 16 enables these to tolerate such clock stopping and maintain state signal values providing the voltage difference applied across the logic block 16 does not fall below a minimum retention voltage.

At step 32 the header blocks 12 are switched to a non-conductive state. In this example, only header blocks are being employed although it will be appreciated that alternatively footer blocks could be employed or header blocks and footer blocks could be used in combination. When the header blocks have been switched off at step 32, processing proceeds around the loop comprising steps 34 and 36 which respectively check that the voltage level on the virtual supply rail 18 has not fallen too low and that no signal has been received indicating that the retention mode is to be exited (pwr_req). If the voltage level is detected as having fallen to low at step 34, then processing proceeds to step 36 at which the header switch 12 (more specifically the weak transistor 22) is switched into its conductive state. The strong transistor 20 can be maintained in its non-conductive state during such modulation. This causes the virtual supply rail voltage to rise.

Steps 38 and 40 then monitor to see if the virtual supply rail voltage has risen above the target maximum and if a signal to execute the retention mode has been received. If the virtual supply rail voltage does exceed the target maximum, then processing returns to step 32 at which the header block is rendered fully non-conductive (e.g. the weak transistor 22 is switched off again with the strong transistor 20 remaining switched off).

If at either step 36 or step 40 it is noted that a signal to exit retention mode has been received (pur-req), then processing proceeds to step 42 at which the header block is switched back to its fully conductive state (e.g. both the strong transistor 20 and the weak transistor 22 are switched on). Step 44 then monitors until an operational level of the virtual supply rail voltage has been reached sufficient to support active processing by the logic block 16. When this operational level of the virtual supply rail voltage has been reached, then step 46 restarts the clock signal.

The circuits described above can have a variety of forms including CMOS transistors, MTCMOS transistors and silicon on insulator devices that are well suited to low power high density implementations.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Power control circuitry for controlling connection of a power source having a source voltage level to a switched power rail used to provide power to an associated circuit block, the power control circuitry comprising:
   a switch block for variably connecting the switched power rail to the power source;
   a switch controller for controlling operation of the switch block;
   ring oscillator circuitry powered from the switched power rail and producing an oscillating output signal; and
   analysis circuitry for analysing change in frequency of the oscillating output signal produced by the ring oscillator circuitry during a period of time when the switched power rail is not at the source voltage level, and to cause the switch controller to control at least one aspect of the operation of the switch block in dependence on said analysis.

2. Power control circuitry as claimed in claim 1, further comprising:
   additional ring oscillator circuitry powered from the power source and producing an additional oscillating output signal;
   the analysis circuitry performing said analysis by comparing frequency of the oscillating output signal with frequency of the additional oscillating output signal and controlling said at least one aspect of the operation of the switch block in dependence on said comparison.

3. Power control circuitry as claimed in claim 2, wherein the additional ring oscillator circuitry and the ring oscillator circuitry are of identical construction.

4. Power control circuitry as claimed in claim 2, wherein:
   said switch controller modulates conduction through said switch block to maintain said virtual power rail at an intermediate voltage level;
   said analysis circuitry analyses a difference in frequency between the oscillating output signal and the additional oscillating output signal in order to derive information indicative of at least one analogue voltage property of the switched voltage rail; and
   said information is input to the switch controller as a feedback signal to adjust said modulation to maintain said intermediate voltage within a predetermined voltage range.

5. Power control circuitry as claimed in claim 4, wherein said switch controller controls a duty ratio of said modulation in accordance with said feedback signal.

6. Power control circuitry as claimed in claim 4, wherein said feedback signal to said switch controller has a hysteresis characteristic such that said intermediate voltage follows a periodic variation within said predetermined voltage range.

7. Power control circuitry as claimed in claim 4, wherein said feedback signal to said switch controller has a hysteresis characteristic such that:
   said switch block is switched to a conductive state when said intermediate voltage has greater than a predetermined maximum difference from said source voltage level as determined by the analysis circuitry; and
   said switch block is switched to a non-conductive state when said intermediate voltage has less than a predetermined minimum difference from said source voltage level as determined by the analysis circuitry.

8. Power control circuitry as claimed in claim 4, wherein the additional ring oscillator circuitry and the ring oscillator circuitry are of identical construction, the power control circuitry further comprising divider circuitry for modifying the oscillating output signal produced by the ring oscillator circuitry before the difference in frequency is determined by the analysis circuitry.

9. Power control circuitry as claimed in claim 4, wherein during normal operation of the associated circuit block the voltage on the switched power rail differs from the source voltage level due to a voltage drop across the switch block, and the analysis circuitry continues to compare the frequency of the oscillating output signal with the frequency of the additional oscillating output signal in order to derive information indicative of said voltage drop.

10. Power control circuitry as claimed in claim 4, wherein
said associated circuit block statically retains one or more state signal values when said associated circuit block is not active and said intermediate voltage results in greater than a minimum retention voltage across said associated circuit block; and
said switch controller modulates conduction through said switch block such that said intermediate voltage results in greater than said minimum retention voltage across said associated circuit block and said one or more state signal values are retained in said associated circuit block with an average leakage current in said associated circuit block less than when said switched power rail is continuously at said source voltage level.

11. Power control circuitry as claimed in claim 1, wherein said switch block is a header block, said power source is a supply voltage rail and said switched power rail is a switched supply voltage rail.

12. Power control circuitry as claimed in claim 1, wherein said switch block is a footer block, said power source is a ground voltage rail and said switched power rail is a switched ground voltage rail.

13. Power control circuitry as claimed in claim 1, wherein said ring oscillator circuitry is gated via an enable signal, during normal operation of the associated circuit block where voltage on the switched power rail is at the source voltage level, the ring oscillator circuitry being disabled to reduce power consumption.

14. Power control circuitry as claimed in claim 13, wherein the ring oscillator circuitry is periodically enabled during the period of time when the switched power rail is not at the source voltage level to further reduce power consumption.

15. Power control circuitry as claimed in claim 1, wherein on turning on at least part of the switch block to begin pulling voltage on the switched voltage rail to the source voltage level, the analysis circuitry analyses the change in frequency of the oscillating output signal in order to derive information indicative of at least one analogue voltage property of the switched voltage rail.

16. Power control circuitry as claimed in claim 15, wherein the switch block comprises multiple switch block portions including at least one starter switch block portion and at least one main switch block portion, and the at least one aspect of the operation of the switch block controlled based on the analysis performed by the analysis circuitry is a determination as to when to turn on the at least one main switch block portion.

17. Power control circuitry as claimed in claim 1, wherein on turning off at least part of the switch block to decouple voltage on the switched voltage rail from the source voltage level, the analysis circuitry analyses the change in frequency of the oscillating output signal in order to derive information indicative of at least one analogue voltage property of the switched voltage rail.

18. Power control circuitry as claimed in claim 17, wherein when subsequently turning on the switch block to begin pulling voltage on the switched voltage rail to the source voltage level, said information is used to influence a turn on procedure employed by the switch controller.

19. Power control circuitry as claimed in claim 1, wherein the analysis performed by the analysis circuitry further provides diagnostic data indicative of turn on characteristics of the switch block.

20. Circuitry for analysing a switched power rail used to provide power to an associated circuit block, the switched power rail being connectable to a power source having a source voltage level, the circuitry comprising:
a switch block for variably connecting the switched power rail to the power source;
a switch controller for controlling operation of the switch block;
ring oscillator circuitry powered from the switched power rail and producing an oscillating output signal; and
analysis circuitry for analysing change in frequency of the oscillating output signal produced by the ring oscillator circuitry during a period of time when the switched power rail is not at the source voltage level in order to produce information characterising at least one analogue voltage property of the switched power rail.

21. A method of controlling connection of a power source having a source voltage level to a switched power rail used to provide power to an associated circuit block, the method comprising the steps of:
variably connecting the switched power rail to the power source via a switch block;
operating ring oscillator circuitry from the switched power rail in order to produce an oscillating output signal;
analysing change in frequency of the oscillating output signal produced by the ring oscillator circuitry during a period of time when the switched power rail is not at the source voltage level; and
controlling at least one aspect of the operation of the switch block in dependence on said analysis.

22. Power control logic for controlling connection of a power source means having a source voltage level to a switched power rail means used to provide power to an associated circuit block means, the power control logic comprising:
a switch block means for variably connecting the switched power rail means to the power source means;
a switch controller means for controlling operation of the switch block means;
ring oscillator means powered from the switched power rail means for producing an oscillating output signal; and
analysis means for analysing change in frequency of the oscillating output signal produced by the ring oscillator means during a period of time when the switched power rail means is not at the source voltage level, and to cause the switch controller means to control at least one aspect of the operation of the switch block means in dependence on said analysis.

* * * * *